(12) United States Patent
Makino et al.

(10) Patent No.: US 7,577,319 B2
(45) Date of Patent: Aug. 18, 2009

(54) SEMICONDUCTOR OPTICAL DEVICE AND MANUFACTURING METHOD THEREOF

(75) Inventors: Shigeki Makino, Kokubunji (JP); Kazunori Shinoda, Musashino (JP); Takeshi Kitatani, Hino (JP)

(73) Assignee: Opnext Japan, Inc., Kanagawa (JP)

( * ) Notice: Subject to any disclaimer, the term of this patent is extended or adjusted under 35 U.S.C. 154(b) by 176 days.

(21) Appl. No.: 11/838,256

(22) Filed: Aug. 14, 2007

(65) Prior Publication Data
US 2008/0219315 A1 Sep. 11, 2008

(30) Foreign Application Priority Data
Mar. 7, 2007 (JP) ............................. 2007-056538

(51) Int. Cl.
*G02F 1/035* (2006.01)
*H01L 21/00* (2006.01)
(52) U.S. Cl. ................. 385/2; 385/1; 385/14; 385/129; 385/130; 385/131; 385/132; 438/29; 438/31
(58) Field of Classification Search ..................... 385/1, 385/2, 3, 14, 15, 31, 40, 41, 97, 98, 129, 385/130, 131, 132, 141; 438/29, 31, 32
See application file for complete search history.

(56) References Cited

U.S. PATENT DOCUMENTS 5,678,935 A * 10/1997 Sakata ........................ 385/131

(Continued)

FOREIGN PATENT DOCUMENTS

JP 2003-110195 4/2003 ............... 385/14 X (Continued)

OTHER PUBLICATIONS

Katsuyuki Utaka, et al.; Effect of Mirror Facets on Lasing Characteristics of Distributed Feedback InGaAsP/InP Laser Diodes at 1.5 um Range; IEEE Journal of Quantum Electronics, Mar. 1984; pp. 236-245; vol. QE-20; No. 3.

*Primary Examiner*—Brian M Healy
(74) *Attorney, Agent, or Firm*—Antonelli, Terry, Stout & Kraus, LLP.

(57) ABSTRACT

A low reflective window structure in an existent electro-absorption optical modulator involves a trading off problem between the increase in the parasitic capacitance and the pile-up. This is because the capacitance density of the pn junction in the window structure is higher compared with the pin junction as the optical absorption region, and the application of electric field to the optical absorption region becomes insufficient in a case of receding the electrode structure from the junction between the optical absorption region and the window structure making it difficult to discharge photo-carriers generated in the optical absorption region. An undope waveguide structure comprising a structure having such compositional wavelength and a film thickness that the compositional wavelength for each of multi-layers constituting the waveguide structure is sufficiently shorter than that of the signal light and the average refractive index is about identical with that in the optical absorption region may be disposed. In a case of forming the electrode structure so as to overlap the junction boundary between the optical absorption region and the undope waveguide, and do not extend on the joined boundary between the undope waveguide and the window structure, increase in the parasitic capacitance due to the pn junction of the window structure and pile up can be suppressed simultaneously.

19 Claims, 20 Drawing Sheets

U.S. PATENT DOCUMENTS

| | | | |
|---|---|---|---|
| 6,343,163 B1 * | 1/2002 | Kawanishi | 385/2 |
| 6,778,751 B2 * | 8/2004 | Tada et al. | 385/131 |
| 7,405,421 B2 * | 7/2008 | Hashimoto et al. | 257/14 |
| 7,476,558 B2 * | 1/2009 | Zhu et al. | 438/23 |
| 2005/0220391 A1 * | 10/2005 | Hashimoto et al. | 385/14 |

FOREIGN PATENT DOCUMENTS

| | | | |
|---|---|---|---|
| JP | 2004-319760 | 11/2004 | 385/14 X |
| JP | 2004-342733 | 12/2004 | 385/14 X |
| JP | 2005-150181 | 6/2005 | 385/14 X |

* cited by examiner

US 7,577,319 B2

SEMICONDUCTOR OPTICAL DEVICE AND MANUFACTURING METHOD THEREOF

CLAIM OF PRIORITY

The present application claims priority from Japanese Application JP 2007-056538 filed on Mar. 7, 2007, the content of which is hereby incorporated by reference into this application.

FIELD OF THE INVENTION

The present invention concerns a semiconductor optical device and a manufacturing method thereof and it particularly relates to a semiconductor optical modulation device and an integrated semiconductor light emitting device formed by integrating the same.

BACKGROUND OF THE INVENTION

Along with rapid popularization of broadband networks, it has become an important subject for optical transceiver modules to increase the operation speed, reduce the size and lower the consumption power. In Metro-area optical communication networks that connect between cities and relay stations, it has been demanded to transmit high speed signals at a communication rate of 10 Gbps through long-distance fibers of from 40 km to 80 km without relay. Further, a trend of increasing the communication speed to 40 Gbps or higher in relay stations, data centers and for short-to-medium distance fiber transmission of about 10 km has become active.

The present invention intends to provide a semiconductor optical modulation device and a semiconductor optical integrated device suitable to high speed, reduced-size and less power consuming optical transceiver modules at a reduced cost.

SUMMARY OF THE INVENTION

Generally, for long-distance transmission at a modulation speed of 10 Gbps or higher or generation of high speed signals at a modulation speed of 40 Gbps or higher, external modulation systems with less chirping capable of high speed modulation are adopted. Among all, semiconductor electro adsorption (EA) modulation device utilizing the electro absorption effect has an excellent property in view of the reduced size, less power consumption, integration property with semiconductor laser diodes (LD), etc. Particularly, a semiconductor optical integrated device in which an EA modulation device and a distributed feedback (DFB) type semiconductor laser of excellent coherency are integrated monolithically on one semiconductor substrate (hereinafter referred to as an EA/DFB laser) has been used generally as a light emitting device for high speed—long distance fiber transmission.

In the EA/DFB laser, when optical feedback caused by light reflection at light emitting edge is incident again to the DFB laser, this causes chirping of the laser leading to deterioration of the transmission property. Accordingly, it has been attempted to reduce the reflection on the front edge and suppress the optical feedback to the laser by forming a low reflective film to the front edge or disposing a window structure or a curved waveguide. Among all, the window structure is a method of decreasing the effect of optical feedback by burying a portion between the optical absorption region and the light emitting edge with a material having a refractive index lower than an average refractive index of the optical absorption region, thereby extending the distribution shape of an optical intensity from the top end of a waveguide structure of the optical absorption region to the light emitting edge and decreasing re-coupling of a light reflected at the light emitting edge to the optical waveguide structure (refer to IEEE Journal of Quantum Electronics, Vol. QE-20, No. 3, 1984, pp. 236-245).

In the existent window structure, while the reflectance can be decreased by a simple method as described above, it involves problems to be described below. As a semiconductor material having a reflective index lower than that of the optical absorption region for forming a window structure, a material identical with the material for a substrate semiconductor is generally used. Further, impurity doping is applied so as to provide an electric conductivity of a polarity opposite to that of a semiconductor substrate in most cases. Accordingly, a pn junction is formed in the window portion. In a case where a voltage applied to a modulation region leaks to the window structure, since the pn junction formed in the window structure functions as a parasitic capacitance to increase a CR time constant, this deteriorates for the high speed response property. This is to be described with reference to FIG. 1. FIG. 1A shows a perspective view of an EA/DFB laser using an existent window structure. FIG. 1B shows a cross sectional view in the direction of an optical axis of the EA/DFB laser using the existent window structure. FIG. 1C is an enlarged view for the periphery of a window structure portion.

Usually, a low reflection film with a reflectance of 1% or less is formed on a light emitting edge in addition to the window structure but this is not illustrated in the drawings. Generally, an optical absorption region 2 in an EA modulator is undoped and forms a pin structure together with an n-InP clad 1 and a p-InP clad 7. "Undope" means herein not to intentionally mix impurities for controlling the polarity of the semiconductor during crystal growth and the like and the impurity concentration is, for example, at $5 \times 10^{16}$ cm$^{-3}$ or lower. On the other hand, the thickness of a depletion layer formed by pn junction in a window structure 6 is less than the thickness of the undope layer in the pin structure of a general optical absorption region. The window structure referred to herein is a structure in which a portion between the optical absorption region 2 and the light emitting edge is buried with a p-InP clad 7 as a semiconductor material having a refractive index lower than that of the optical absorption region 2. Since the static capacitance formed by the junction is in inverse proportion to the thickness of the depletion layer or the thickness of the undope layer, the window structure 6 has a larger static capacitance per unit area compared with that of the optical absorption region 2. For example, in the structure shown in FIG. 1C, assuming the doping concentration of the n-InP clad 1 as $1 \times 10^{18}$ cm$^{-3}$ and the doping concentration of the p-InP clad 7 as $1 \times 10^{18}$ cm$^{-3}$, the thickness of the depletion layer of the pn junction is from 40 nm to 50 nm. This is a thickness of about one to several of the undope layer formed in a general electro absorption optical modulator. Further, the static capacitance of the entire EA modulator is estimated as about 0.25 pF in a case of assuming the thickness of the undope layer of the optical absorption region 2 as 200 nm, the mesa width of a ridge waveguide structure 9 formed on the optical absorption region 2 as 2 µm, the modulator length which is the length in the direction of the optical axis of the optical absorption region 2 as 200 µm, the width of the ridge waveguide structure 9 perpendicular to the direction of the optical axis of a region formed above the ridge waveguide structure 9 as 10 µm, and the area of a pad portion for wire bonding in the EA modulator electrode 12 as 3600 µm$^2$, and assuming that the structure is planarized by a polyimide resin 11 having a dielectric constant of 1.5. In this case, increase of the parasitic capacitance in a case where a voltage applied to the EA modulator should leak to the window structure is estimated by calculation.

FIG. 1D shows a displacement shown by arrows in FIG. 1C from the optical absorption region top end 2' to a p⁺ contact layer top end 8' applied with p-doping at a high concentration and in contact with the EA modulator electrode 12 on the abscissa, and change of the total static capacitance of the EA modulator assuming that a voltage applied to the electrode is effectively applied to a lower portion of the contact layer 8 on the ordinate. In the abscissa, the abscissa is defined as positive in a case where the p⁺ contact layer top end 8' is formed nearer to the light emitting edge than the optical absorption region top end 2'. In FIG. 1D, the dotted line indicates the parasitic capacitance due to the pn junction of the window structure 6 and the solid line indicates the total capacitance for the EA modulator. In view of FIG. 1D, it can be seen that the total static capacitance of the EA modulator increases in about 30% by the displacement only of about 5 μm. This is because the width of the depletion layer due to the simple pn junction is less than that of the undope layer formed to the EA modulator portion and the static capacitance per unit area is larger.

For suppressing the increase of the static capacitance due to the pn junction of the window structure 6, as shown in FIG. 2, p⁺ contact layer top end 8' applied with p-doping at a high concentration may be retracted from the optical absorption region top end 2' relative to the light emitting edge. However, in a case of retracting the p⁺ contact layer top end 8' greatly from the optical absorption region top end 2' so that the voltage applied to the optical absorption region 2 does not leak to the window structure, application of an electric field to the vicinity of the junction portion between the optical absorption region 2 and the window structure 6 becomes insufficient. As a result, photo-carriers caused by basic absorption are less discharged, for example, in a portion of the optical absorption region 2 surrounded by a dotted line in FIG. 2. When the photo-carriers are not discharged but remain in the optical absorption region, the electric field applied to the EA modulator is offset by the electric field screening effect and switching of light absorption/transmission in the EA modulator can no more follow the modulation voltage. This is a so-called pile-up phenomenon which deteriorates the high speed response property like increase of the electrostatic capacitance. Accordingly, in the electro absorption optical modulator using the window structure, a demand for fabrication accuracy is severe upon forming the electrode structure, specifically, for the positional relation for the window structure, the optical absorption region top end, and the contact layer because of trade-off between the increase of the parasitic capacitance and the generation of the pile-up, and this has hindered improvement for the yield in view of the performance of the EA modulator.

For solving the trade-off between the increase of the parasitic capacitance and the pile-up, an undope optical waveguide structure 4' in which the compositional wavelength for each of multi-layers constituting the waveguide structure is sufficiently shorter than that of a signal light and an average refractive index for the entire waveguide structure is about identical with that of the optical absorption region may be disposed between the optical absorption region 2 and the window structure 6 as illustrated in FIGS. 3A and 3B. FIG. 3A is an entire view for the cross section along the direction of an optical axis of a device using a novel window structure according to the invention, and FIG. 3B is an enlarged view for the periphery of the novel window structure according to the invention. "Undope" means herein not to intentionally mix impurities for controlling the polarity of the semiconductor during crystal growth and the like and the impurity concentration is, for example, at $5\times10^{16}$ cm⁻³ or lower. A pin junction is formed by inserting such an undope layer between an n-InP clad 1 and a p-InP clad 7. Since the thickness of the undope layer is larger than the thickness of a depletion layer formed by the pn junction in the window structure 6, the static capacitance per unit area can be decreased greatly. Accordingly, even when the p⁺ contact layer 8 of the electrode for use in the EA modulator is formed above the undope waveguide layer 4', increase of the parasitic capacitance can be suppressed.

For showing the effect of the newly proposed window structure, FIG. 4A shows displacement from the optical absorption region top end 2' to the p⁺ contact layer top end 8' on the abscissa and the change of total static capacitance of the EA modulator assuming that the voltage applied to the electrode is effectively applied to a lower portion of the p⁺ contact layer 8 in the existent window structure and the novel window structure. The abscissa is defined as positive in a case where the p⁺ contact layer top end 8' is formed nearer to the light emitting edge than the optical absorption region top end 2'. Further, it is assumed here that the thickness of the undope optical waveguide 4' is 200 nm and the values of other parameters are identical with those calculated shown in FIG. 1D. In FIG. 4A, a dotted line shows values for the existent window structure and a solid line shows values for the window structure using the new proposed waveguide 4'. As shown in FIG. 4A, increase of the static capacitance is suppressed to about one-to-several compared with that in the existent window structure as shown in FIG. 1. Further, FIG. 4B shows the result of calculation for $f_{3dB}$ bandwidth calculated on the basis of the change of the static capacitance. The dotted line shows the value when using the existent window structure and the solid line shows the value when using the new window structure. As shown, in the new window structure, even when the p⁺ contact layer 8 is formed overriding the junction boundary between the optical absorption region 2 and the undope optical waveguide 4', the amount of the degradation in the high speed response bandwidth is extremely small compared with that of the existent structure.

Further, while the voltage is applied, in the same manner as the optical absorption region 2, also to a portion of the undope optical waveguide 4' in the new window structure, since the positional wavelength constituting the undope optical window guide 4' sufficiently shorter than that of the signal light, the optical absorption in the undope optical waveguide 4' is negligibly small. For example, the structure of the undope optical waveguide 4' is formed as a structure by stacking an InGaAsP growing layer of 100 nm thickness and 1300 nm composition wavelength succeeding to an InGaAsP bulk growing layer of 50 nm thickness and 1150 nm compositional wavelength, and further stacking an InGaAsP bulk grown layer of 50 nm thickness and 1150 nm compositional wavelength. In this case, the thickness of the undope layer is 200 nm. FIG. 4C shows the result of calculation for optical absorption due to Franz-Keldysh effect in a case of assuming the length as 50 μm in the direction of an optical length to which a voltage is applied effectively and in a case where a signal light at a wavelength of 1.55 μm is incident to the undope optical waveguide 4'. As shown in the drawing, even in a case of applying a high voltage of −5V, the static extinction ratio in the undope optical waveguide 4' is about 0.5 dB and the light is scarcely absorbed. Considering that the length of the undope optical waveguide 4' to which a voltage is applied effectively is further shorter in the actual application use and the practical modulation voltage amplitude of the EA modulator is about −2 V, it can be said that hot carriers generated in the undope optical waveguide 4' may be negligibly small. Accordingly, the pile-up phenomenon described above is not caused. Accordingly, it does not give hindrance in view of the high speed modulation operation. Accordingly, the electrode structure for the modification region can completely cover the optical absorption region and can suppress the occurrence of the pile-up phenomenon with no worry for the increase of the parasitic capacitance.

As has been described above, the invention can provide, in an electro absorption optical modulation device, a window structure of low reflectance capable of overcoming trade off between the increase of the parasitic capacitance and the pile-up, not requiring high fabrication accuracy, and excellent in high speed response property. Further, the device can be manufactured at a good production yield in the manufacturing method therefor.

The present invention is suitable, for example, to an uncooled EA/DFB laser designed so as to operate for a wide temperature range and an EA/DFB laser of high speed modulation, for example, 40 Gbps. Further, an optical device integrated with an optical modulation device corresponding to a wide wavelength variable width can be attained by integration with a wavelength tunable optical source.

DETAILED DESCRIPTION OF THE PREFERRED EMBODIMENTS

Figure 1A:
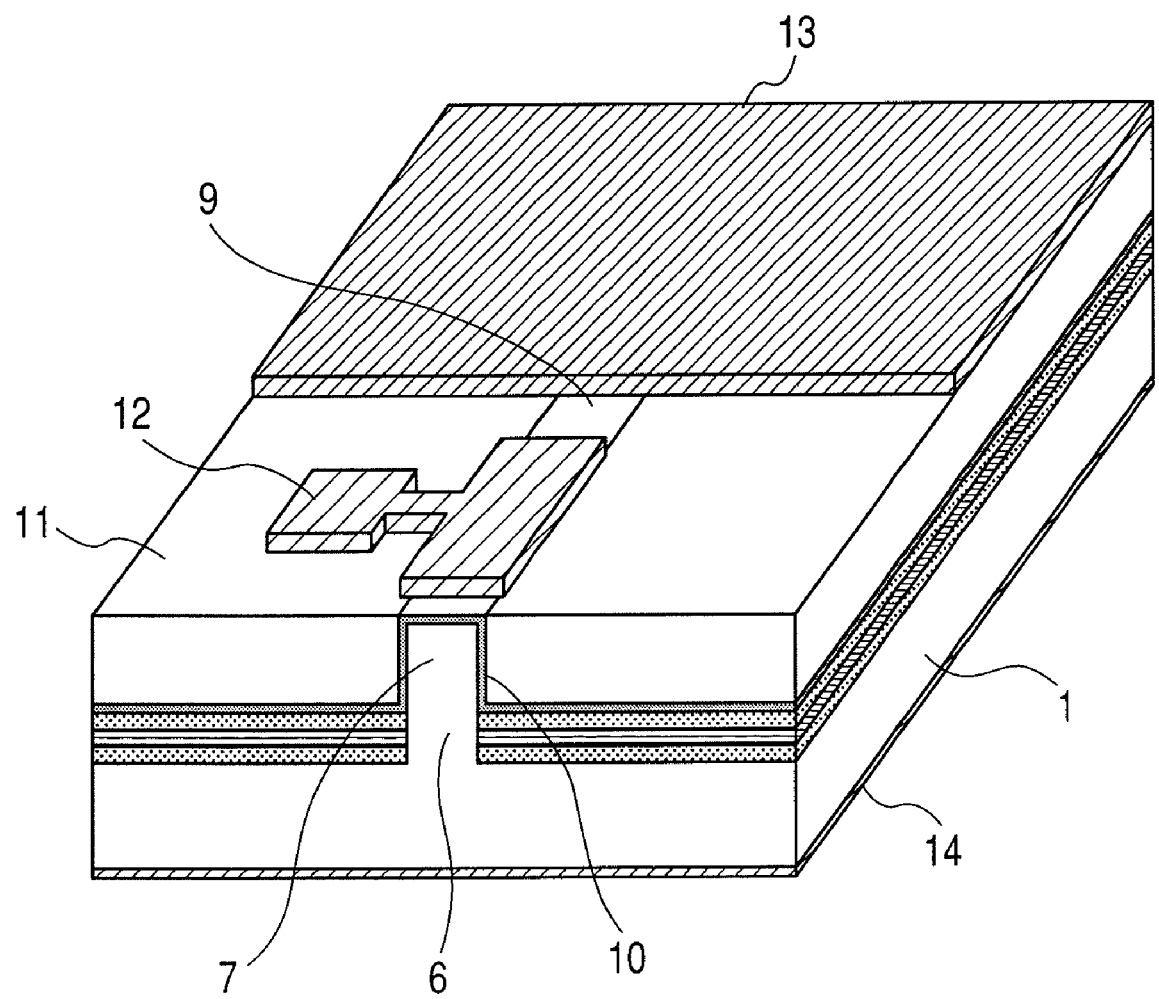
FIG. 1A is a perspective view of an EA/DFB laser using an existent window structure.
Figure 1B:
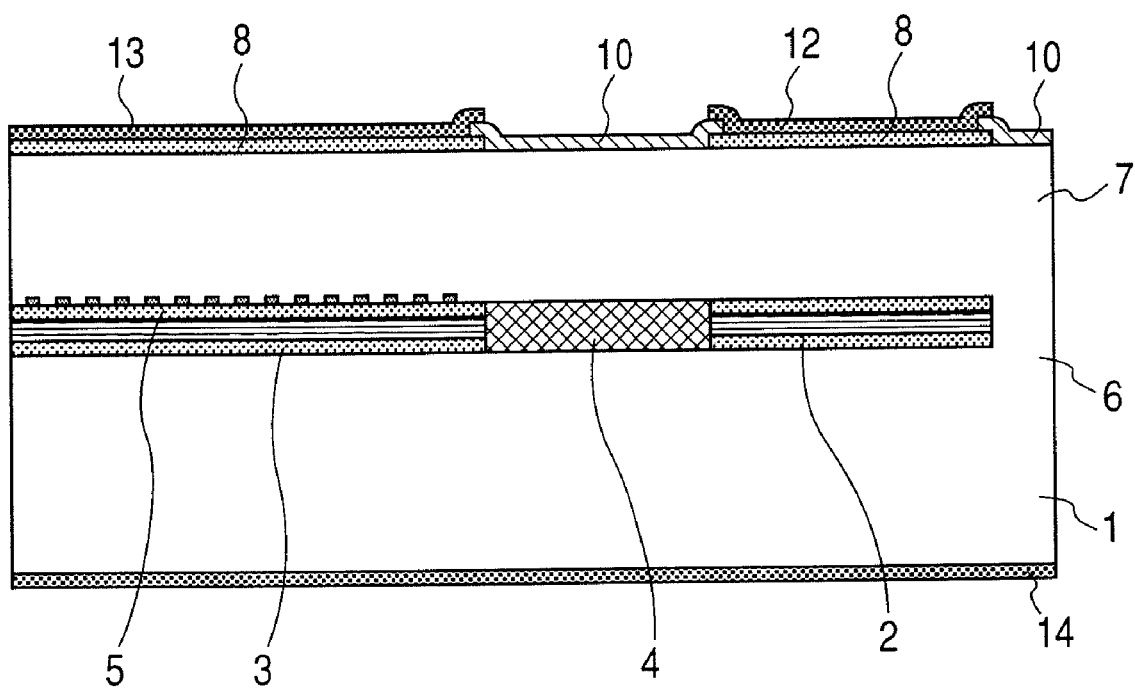
FIG. 1B is a cross sectional view taken along an optical axis of an EA/DFB laser using an existent window structure.
Figure 1C:
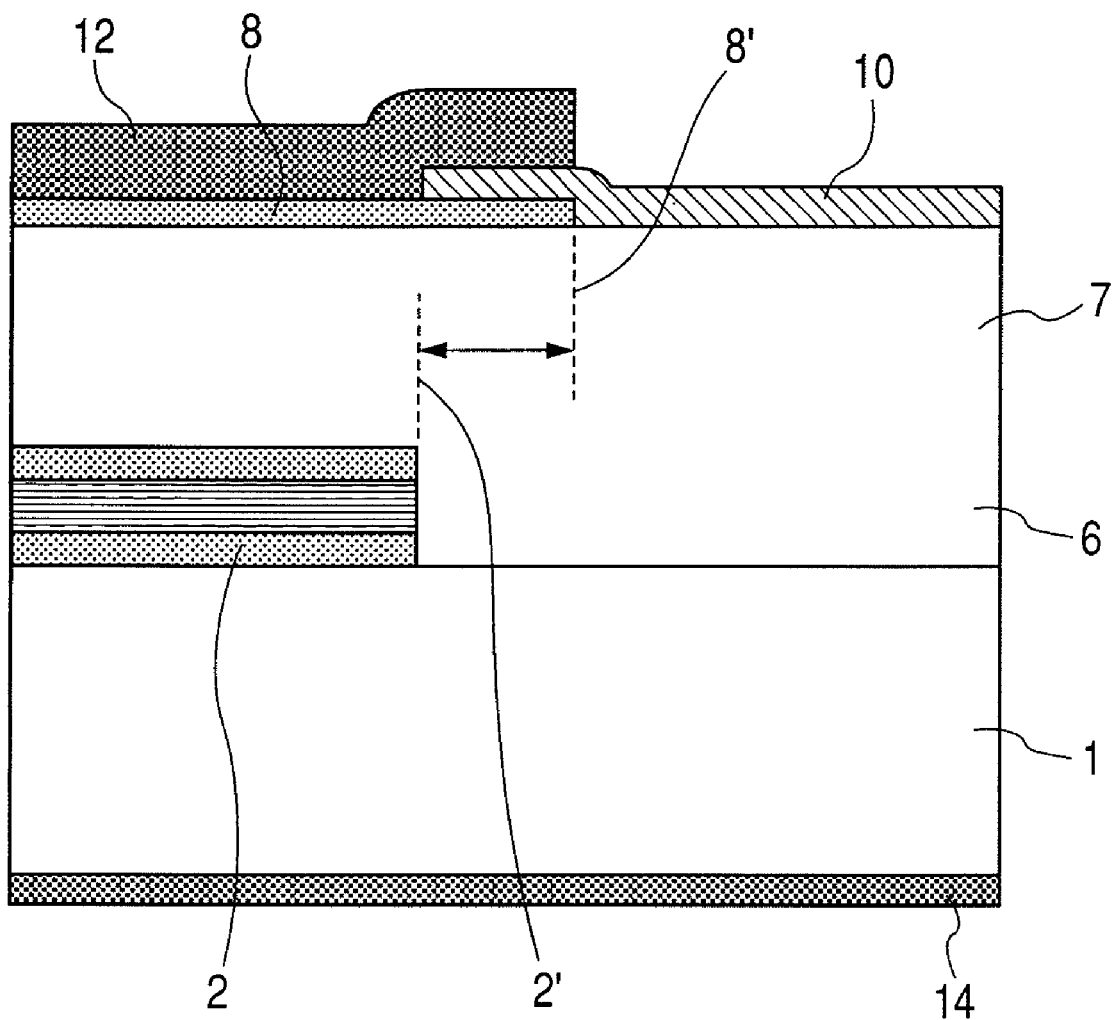
FIG. 1C is a schematic view enlarged for the periphery of the existent window structure.
Figure 1D:
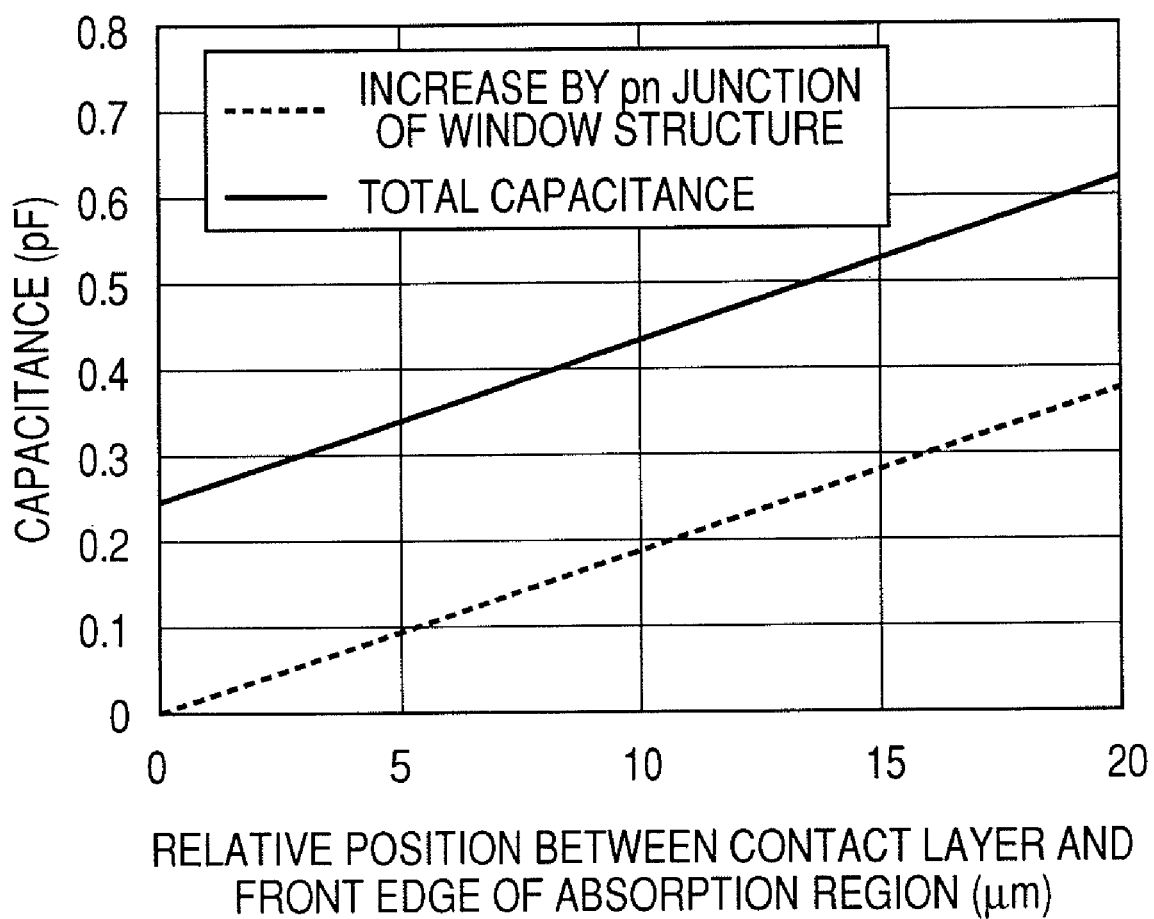
FIG. 1D is a view showing an example of calculation for the increase of a parasitic capacitance by the existent window structure.
Figure 2:
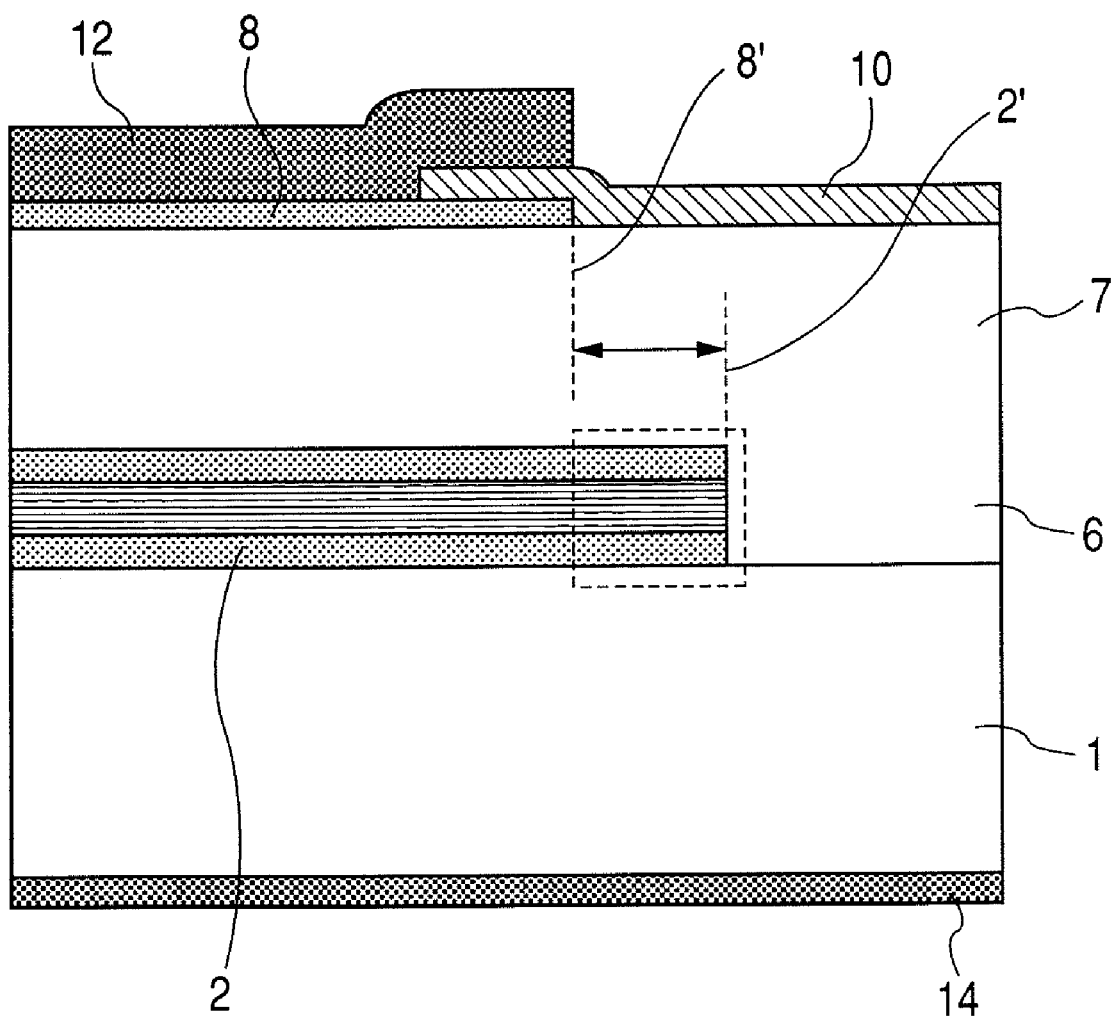
FIG. 2 is a view showing a pile up phenomenon in a schematic view of an EA/DFB laser using the existent window structure.
Figure 3A:
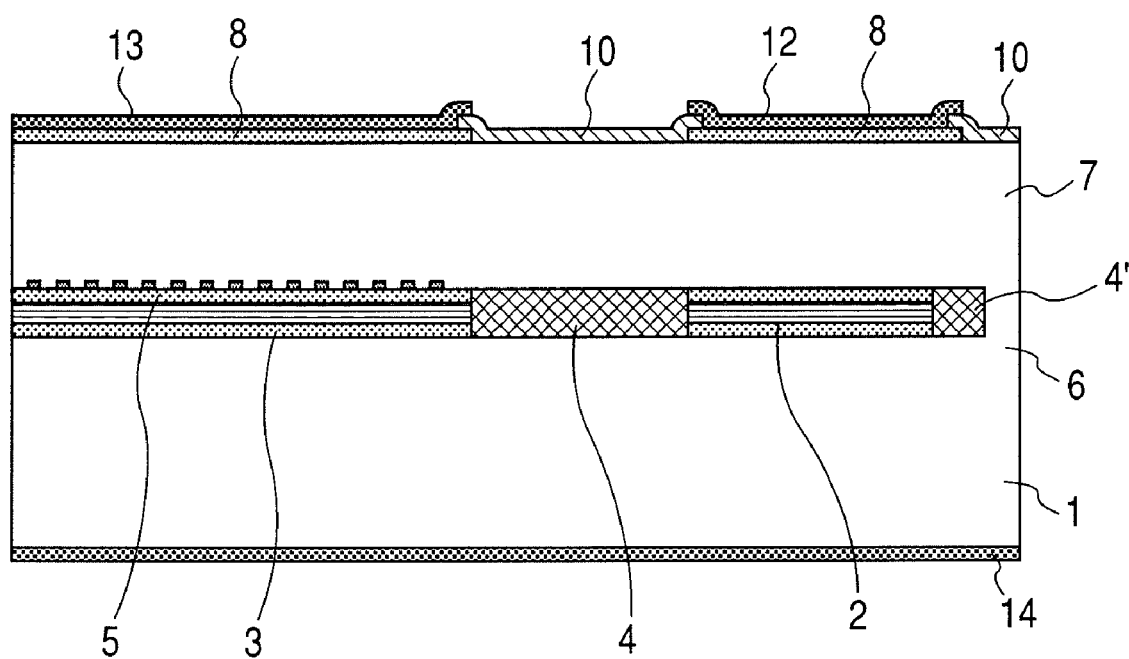
FIG. 3A is a cross sectional view taken along an optical axis of a semiconductor optical integrated device using a novel window structure according to the invention.
Figure 3B:
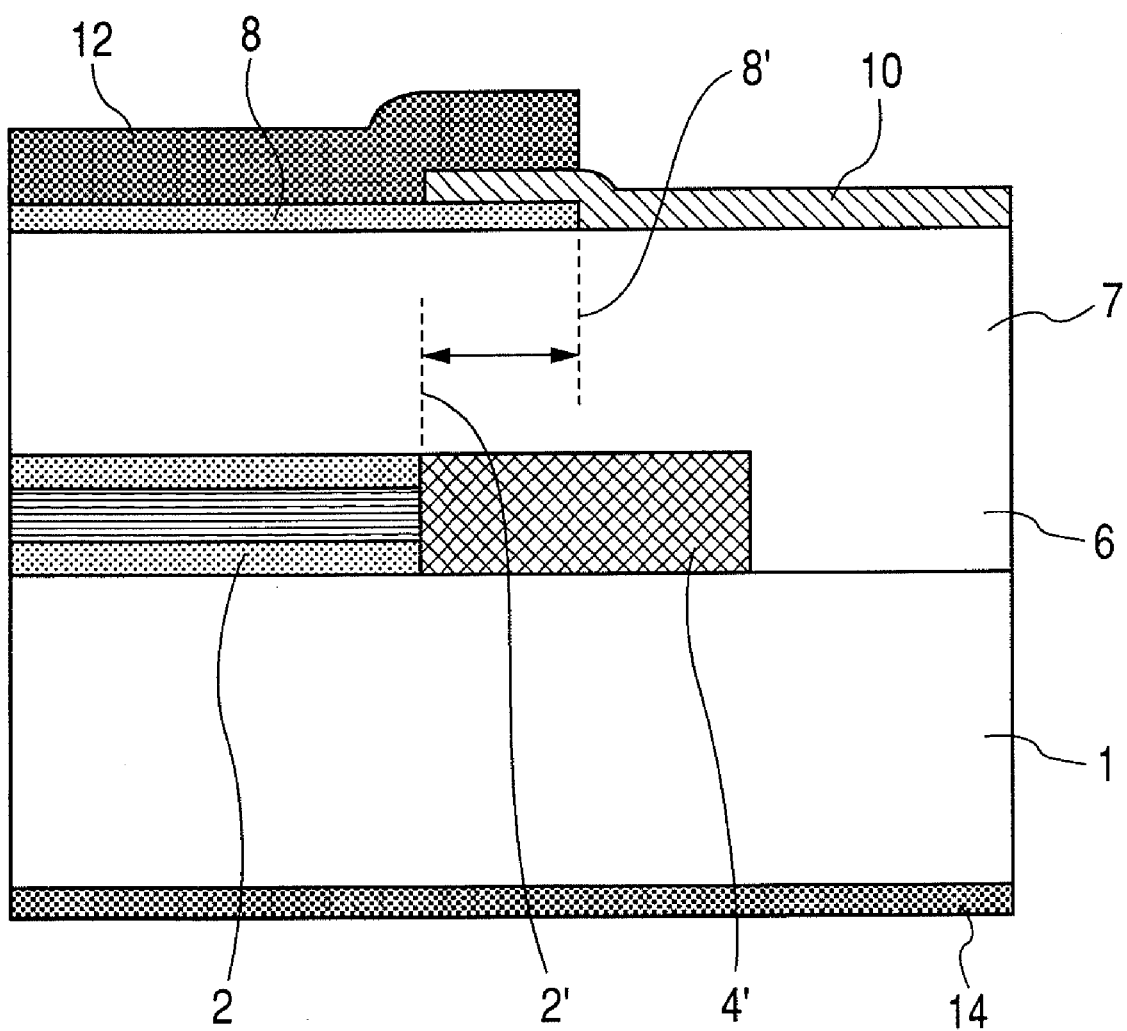
FIG. 3B is a schematic view enlarged for the periphery of a novel window structure according to the invention.
Figure 4A:
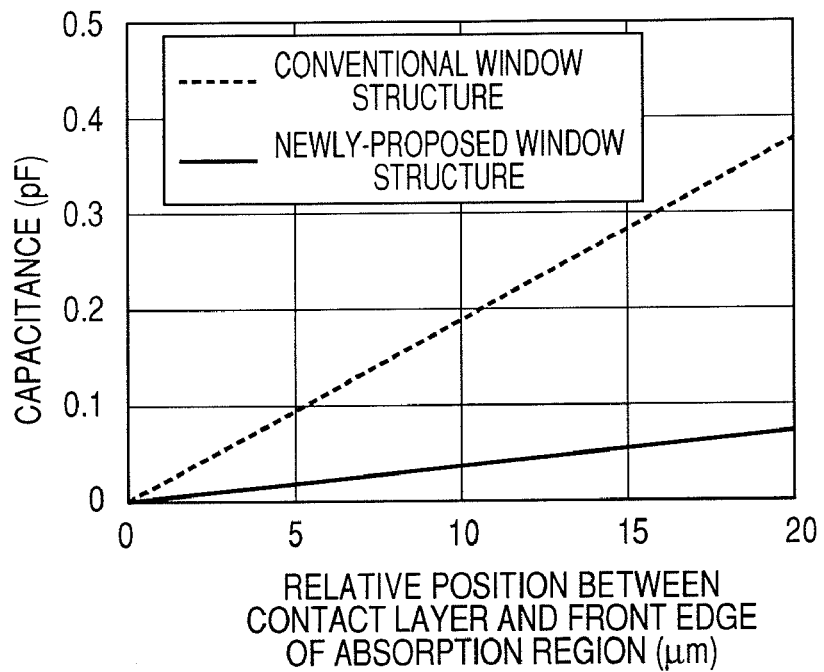
FIG. 4A is a view for explaining the suppression of increase in the parasitic capacitance by the novel window structure according to the invention.
Figure 4B:
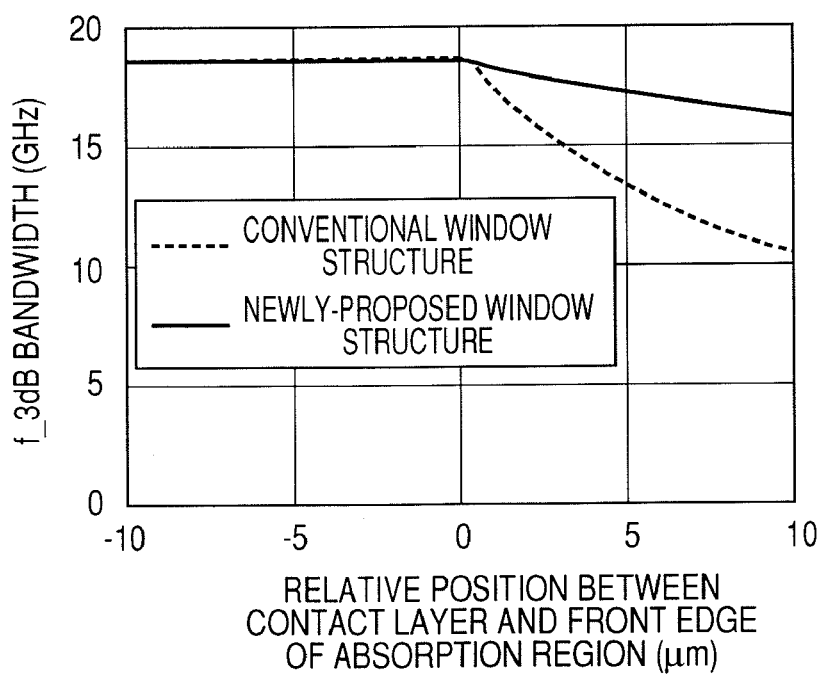
FIG. 4B is a view for explaining the suppression of deterioration in a $f_{3db}$ bandwidth by the novel window structure according to the invention.
Figure 4C:
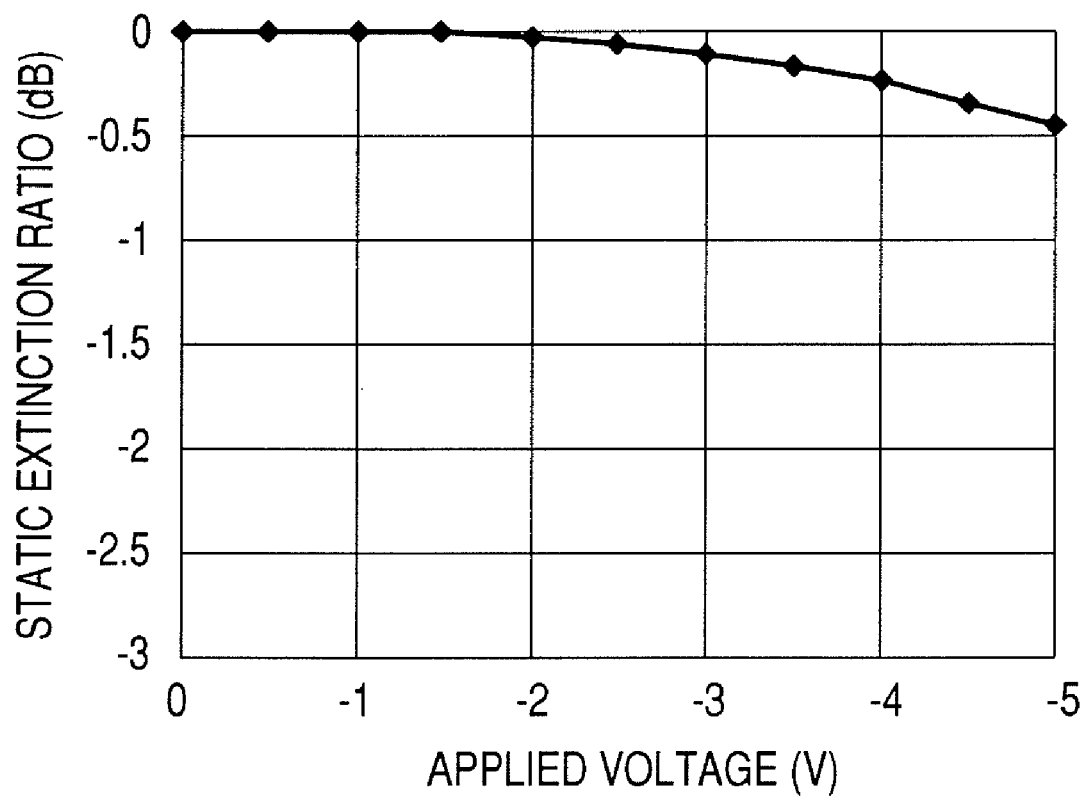
FIG. 4C is a view describing optical absorption in the novel window structure according to the invention.

Preferred embodiments of the present invention are to be described by way of first to fifth embodiments in conjunction with respective related drawings.

First Embodiment

This embodiment concerns an RWG-EA/DFB(DBR).

Manufacturing steps of a semiconductor optical integrated device applied with the invention are to be described with reference to FIG. 5.

However, the drawings are only for description of this embodiment and the size of the drawing and the reduced scale described in this embodiment do not always agree to each other.

Figure 5A:
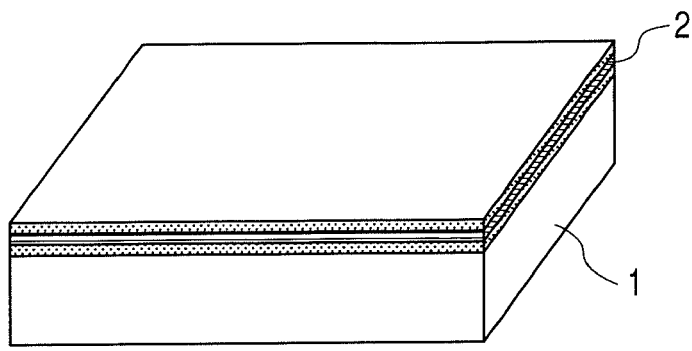
FIG. 5A is a view showing a manufacturing step of a semiconductor optical integrated device in a first embodiment of the invention.
Figure 5B:
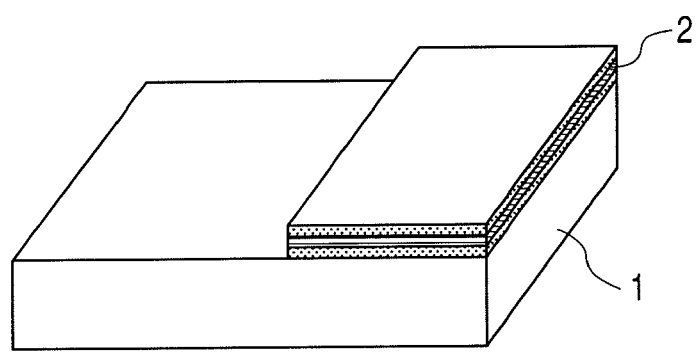
FIG. 5B is a view showing a manufacturing step of a semiconductor optical integrated device in a first embodiment of the invention.

A quantum well structure 2 comprising an InGaAlAs-based material as an electro-absorption optical modulation region is formed by an MOCVD method above an n-InP type substrate 1 (FIG. 5A). For the quantum well structure, an optical confinement structure sufficient for extinction can be formed by alternately stacking quantum wells and barrier layers by about 10 layers. Successively, etching is conducted as far as the surface of the n-InP substrate 1 while leaving a predetermined length of an electro-absorption optical modulator (FIG. 5B). Further, the etching technique for the semiconductor layer having In, Ga, Al, As is described specifically, for example, in JP-A No. 2005-150181.

Figure 5C:
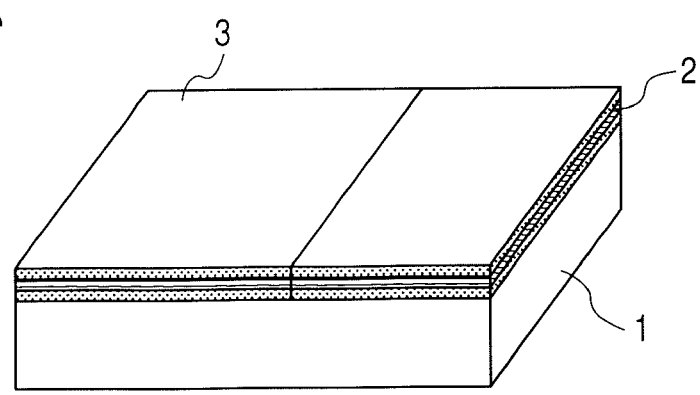
FIG. 5C is a view showing a manufacturing step of a semiconductor optical integrated device in a first embodiment of the invention.

Then, there is formed a quantum well structure 3 including an InGaAlAs-based material forming a semiconductor laser portion by an MOCVD method (FIG. 5c). Further, an optical confinement structure suitable to laser oscillation can be formed by alternately stacking quantum wells and barrier layers by about 8 layers.

Figure 5D:
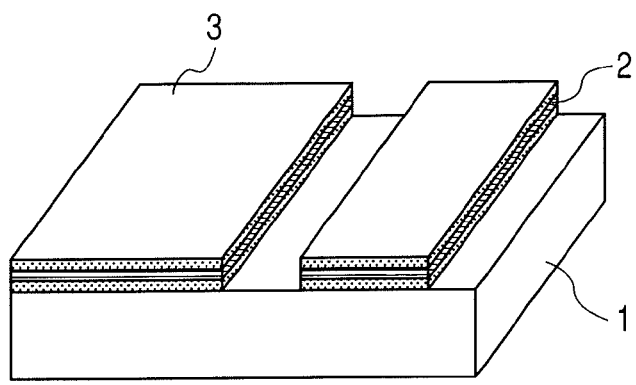
FIG. 5D is a view showing a manufacturing step of a semiconductor optical integrated device in a first embodiment of the invention.

Successively, etching is conducted as far as the surface of the n-InP substrate 1 while leaving predetermined length of the electro-absorption optical modulator and the semiconductor laser portion so as not to give undesired effects on the electro-absorption optical modulator portion 2 and the semiconductor laser portion 3 (FIG. 5D). In this case, a portion between the electro-absorption optical modulator portion 2 and the semiconductor laser portion 3, and a portion between a light emitting edge and the electro-absorption optical modulator portion 2 are etched simultaneously as shown in the drawing. Further, the etching technique is described specifically in JP-A No. 2005-150181.

Figure 5E:
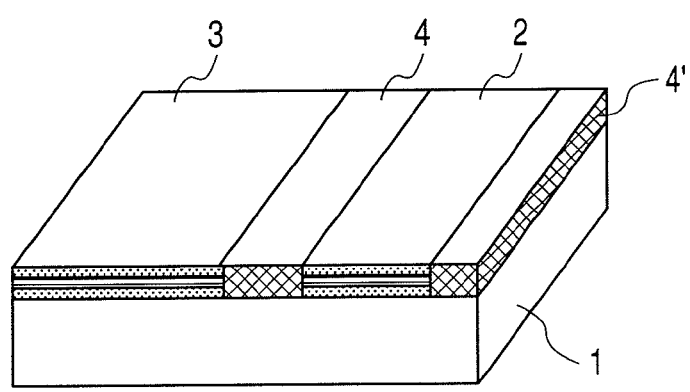
FIG. 5E is a view showing a manufacturing step of a semiconductor optical integrated device in a first embodiment of the invention.

Then, an optical waveguide layer 4 comprising an InGaAsP-based material is formed between the electro-absorption optical modulator portion 2 and the semiconductor laser portion 3 described above. Further, an optical waveguide layer 4' comprising an InGaAsP-based material is formed between the light emitting edge and the electro-absorption optical modulator portion 2 (FIG. 5E). As a detailed structure of the optical waveguide layer 4 and the optical waveguide layer 4', a structure formed, for example, by stacking an InGaAsP grown layer of 200 nm thickness and 1300 nm compositional wavelength successively to an InGaAsP bulk grown layer of 100 nm thickness and 1150 nm compositional wavelength, and further stacking an InGaAsP bulk grown layer of 100 nm thickness and 1150 nm compositional wavelength is preferred. With the structure described above, an optical waveguide layer with less optical loss can be formed.

Figure 5F:
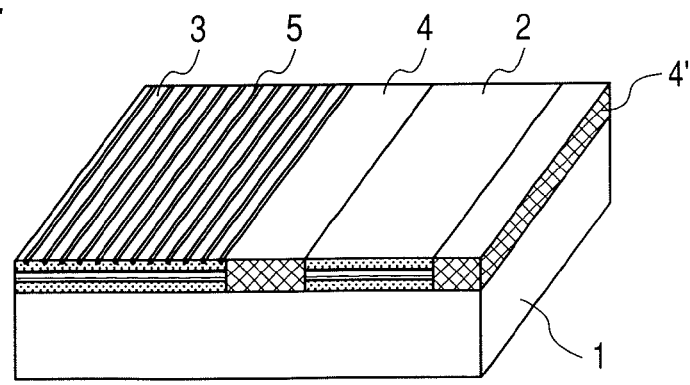
FIG. 5F is a view showing a manufacturing step of a semiconductor optical integrated device in a first embodiment of the invention.
Figure 5G:
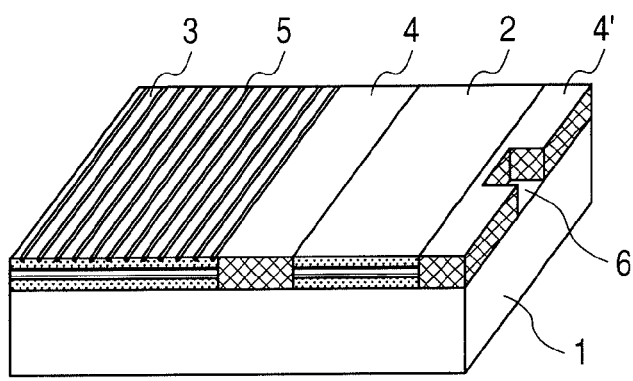
FIG. 5G is a view showing a manufacturing step of a semiconductor optical integrated device in a first embodiment of the invention.

Then, a diffraction grating is formed by etching above the quantum well structure 3 comprising an InGaAlAs-based material forming the semiconductor laser portion 3 (FIG. 5F). As the diffraction grating layer, a semiconductor with a refractive index higher than that of InP is preferred. For example, an InGaAsP grown layer of 30 nm thickness and 1150 nm compositional wavelength is preferred. For the formation of the diffraction grating, pattern formation to a resist by a holographic exposure method or an electron beam drawing method and a wet or dry etching process as known techniques may be combined. As a specific resist pattern, stripes at about 240 nm distance may be formed in the direction perpendicular to a mesa (direction crossing the extending direction of each trapezoidal portion). This can provide a stable longitudinal single mode oscillation suitable to optical communication Then, a portion of the optical waveguide layer 4' comprising an InGaAsP-based material between the light emitting edge and the electro-absorption optical modulator portion 2 on the side of the light emitting edge formed in FIG. 5E is etched as far as the n-InP substrate 1 to form a window structure 6 (FIG. 5G).

Figure 5H:
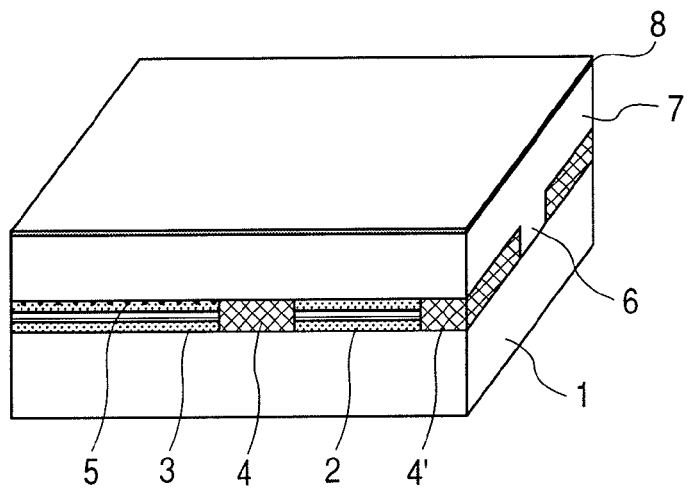
FIG. 5H is a view showing a manufacturing step of a semiconductor optical integrated device in a first embodiment of the invention.
Figure 5I:
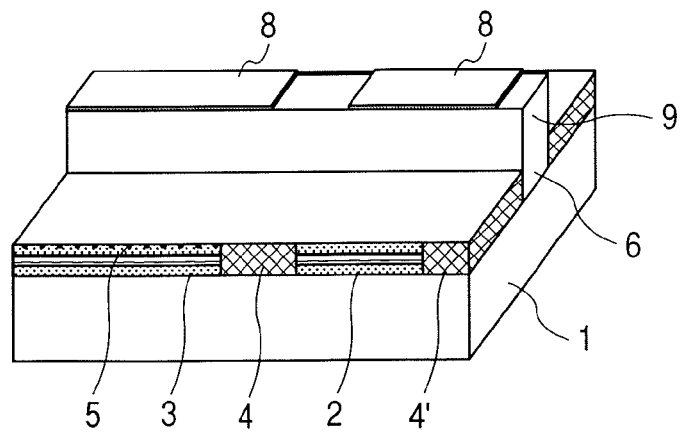
FIG. 5I is a view showing a manufacturing step of a semiconductor optical integrated device in a first embodiment of the invention.

Successively, a p-InP layer 7 and a p$^+$ contact layer 8 are formed by an MOCVD method (FIG. 5H). Then, the p$^+$ contact layer 8 and the p-InP layer 7 is etched as far as surface of the quantum well structure 2 comprising the InGaAlAs-based material forming the electro-absorption optical modulator, the quantum well structure 3, the optical waveguide layer 4, and the optical waveguide layer 4' comprising the InGaAlAs-based material forming the semiconductor laser portion except for the portion forming the ridge waveguide to form a mesa waveguide structure 9. In this case, stable transverse single mode oscillation suitable to optical communication is obtained by defining the mesa width to about 2 μm. Successively, for electrically isolating the electro-absorption optical modulator portion 2 and the semiconductor laser portion 3 and forming the newly proposed window structure, the p$^+$ contact layer 8 is removed by etching while leaving a desired portion (FIG. 5I).

Figure 5J:
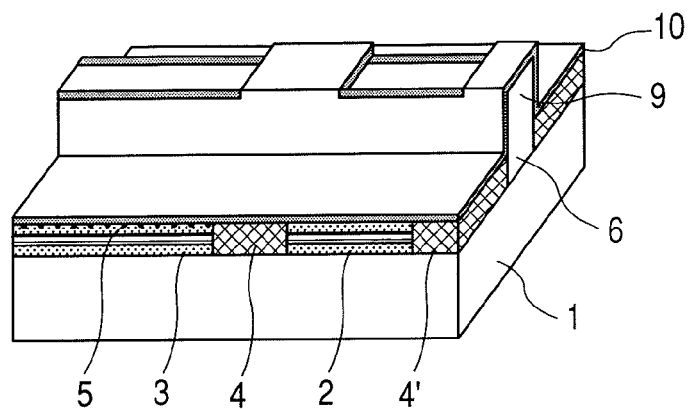
FIG. 5J is a view showing a manufacturing step of a semiconductor optical integrated device in a first embodiment of the invention.

Successively, after forming a silicon oxide film 10 over the entire surface by a CVD method, the silicon oxide film 10 is removed only for the top surface of the mesa waveguide 9 for the semiconductor laser portion 3 and the electro-absorption optical modulator portion 2 (FIG. 5J). While the silicon oxide film is used in this embodiment, a silicon nitride film or the like may also be used instead.

Figure 5K:
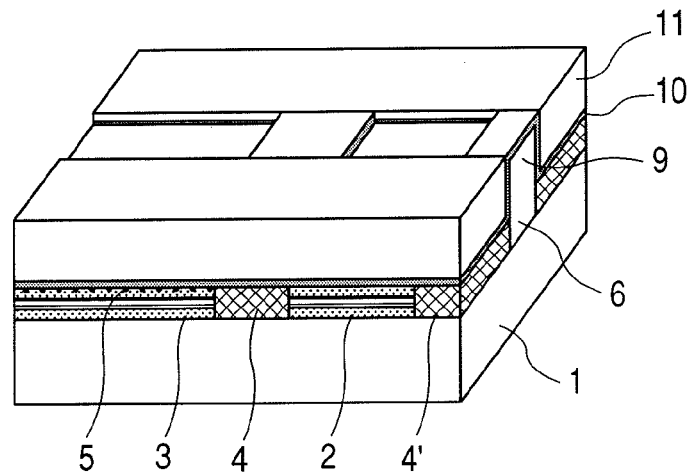
FIG. 5K is a view showing a manufacturing step of a semiconductor optical integrated device in a first embodiment of the invention.
Figure 5L:
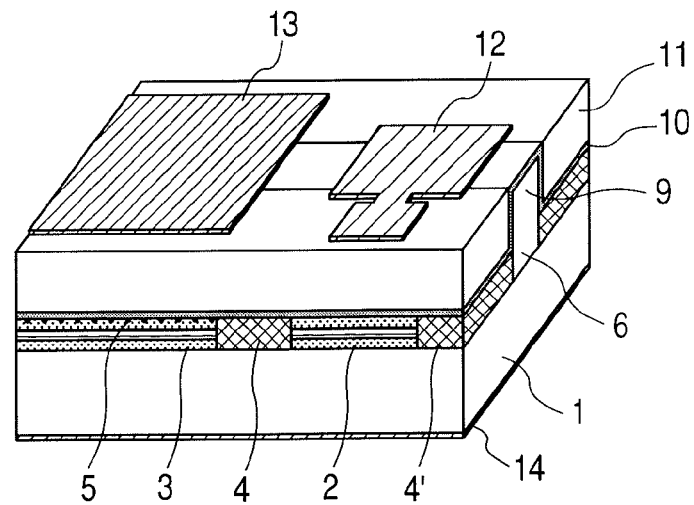
FIG. 5L is a view showing a manufacturing step of a semiconductor optical integrated device in a first embodiment of the invention.

Then, the wafer is planarized with a polyimide resin 11 conforming the top surface of the mesa waveguide 9 removed with the silicon oxide film 10 (FIG. 5K). Successively, a p-electrode 12 for the optical modulator portion and a p-electrode 13 for the semiconductor laser portion are formed. As the electrode material, known Ti and Au may be stacked successively. Then, an n-electrode 14 is formed at the back surface of the n-InP substrate 1. As the electrode material, known AuGe, Ti, and Au may be stacked successively (FIG. 5L). After forming the electrode, the device is cut out by cleaving to form a reflection film at a reflectance of about 90% on the rear edge and a low reflection film at a reflectance of 1% or less is formed on the front edge. In the drawings, such films are not illustrated.

According to the method described above, a ridge waveguide type semiconductor optical integrated device in which the EA modulator portion and the DFB laser portion are integrated on one identical substrate can be prepared. The order of crystal growth of the electro-absorption optical modulator portion 2, the optical waveguide portion 4, the optical waveguide portion 4', and the semiconductor laser portion 3 is not restricted thereto. For example, the obtained device structure does not change even when the DFB laser portion is formed initially. As the material for the electro-absorption optical modulation portion 2, the quantum well structure may comprises InGaAlAs, InGaAsP, InGaAs or GaInNAs for the well layer and the barrier layer may comprise InGaAlAs, InAlAs, or GaInNAs. Further, as the material for the semiconductor laser portion, InGaAsP or GaInNAs-based material may also be used instead of the InGaAlAs-based material. Further, as the material for the optical waveguide layer 4 and the optical waveguide layer 4', the InGaAlAs-based material or GaInNAs-based material may also be used instead of the InGaAsP-based material. Further, formation of the optical waveguide layer 4 and the optical waveguide layer 4' in FIG. 5E is not necessarily conducted simultaneously but this is convenient since the number of cycles for crystal growth is reduced. Further, the optical waveguide layer 4 between the electro-absorption optical modulation portion 2 and the semiconductor layer portion 3 is not always necessary.

Further, the crystal growth method is not always restricted to the MOCVD method but it may be formed by an MBE method or the like. Further, the electro-absorption optical modulator portion 2, the optical waveguide portion 4, the optical waveguide portion 4', and the semiconductor laser portion 3 may be formed by a crystal growth step for once using a selective area growth method. Further, the material for planarizing the wafer is not restricted to the polyimide. Furthermore, planarization by the polyimide or the like is not always necessary.

From the procedures described above, also the method of manufacturing the device in a case where the DFB laser portion is replaced with a structure having other optical functions such as a DBR laser or SOA can be deduced easily.

Then, an operation method of a ridge waveguide type semiconductor optical integrated device of the first embodiment is to be described. By applying a forward bias to the p-electrode 13 for the semiconductor laser portion, laser oscillation is obtained. In this case, since a light undergoes periodical feedback by the diffraction grating 5, the oscillation spectrum becomes a single mode. The laser light passes through the optical waveguide 4 and is incident to the electro-absorption optical modulation portion 2. By applying a reverse bias to the p-electrode 12 for the optical modulation portion, the laser light is absorbed. The light can be turned on and off (transmission and absorption) by turning the application of the reverse bias voltage to off and on. The laser light passing the electro-absorption optical modulation portion 2 emits to the outside of the device passing through the optical waveguide 4' and the window structure 6 disposed between the electro-absorption optical modulation portion 2 and the window structure 6. Thus, an EA/DFB laser device (element) with the optical feedback at the light emitting edge being reduced can be obtained.

Second Embodiment

Figure 6:
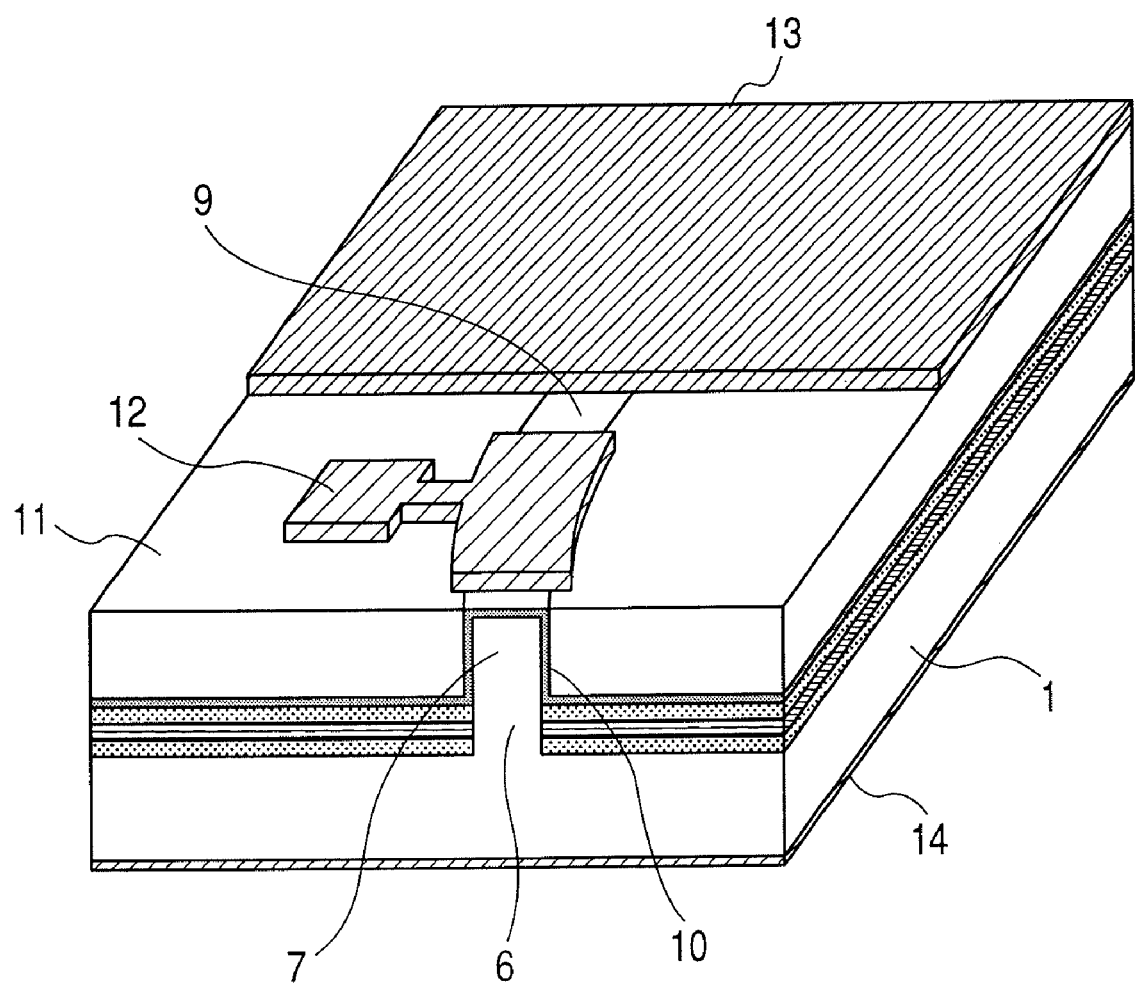
FIG. 6 is a perspective view of a curved waveguide type semiconductor optical integrated device with an optical axis being in a curved shape of a second embodiment according to the invention.

In the ridge waveguide type semiconductor optical integrated device described in the first embodiment, the optical feed back at the light emitting edge can be further decreased by forming a curved waveguide 9' having an optical axis thereof in a curved shape from the vicinity of the junction portion between the semiconductor laser portion 3 and the optical waveguide 4 to the light emitting edge upon forming the mesa waveguide 9 described in FIG. 5I. FIG. 6 shows a perspective view of a curved waveguide type semiconductor optical integrated device. Since the method of manufacturing the curved waveguide type semiconductor optical integrated device is not different at all from the method described for FIG. 5A to FIG. 5L except for the shape of the waveguide 9' formed in FIG. 5I as described above, detailed description is to be omitted.

Further, since the operation method of the curved waveguide type semiconductor integrated device described in the second embodiment is not different at all from the operation method in the first embodiment, detailed descriptions are to be omitted.

Third Embodiment

This embodiment concerns a BH type EA/DFB(DBR).

Figure 7A:
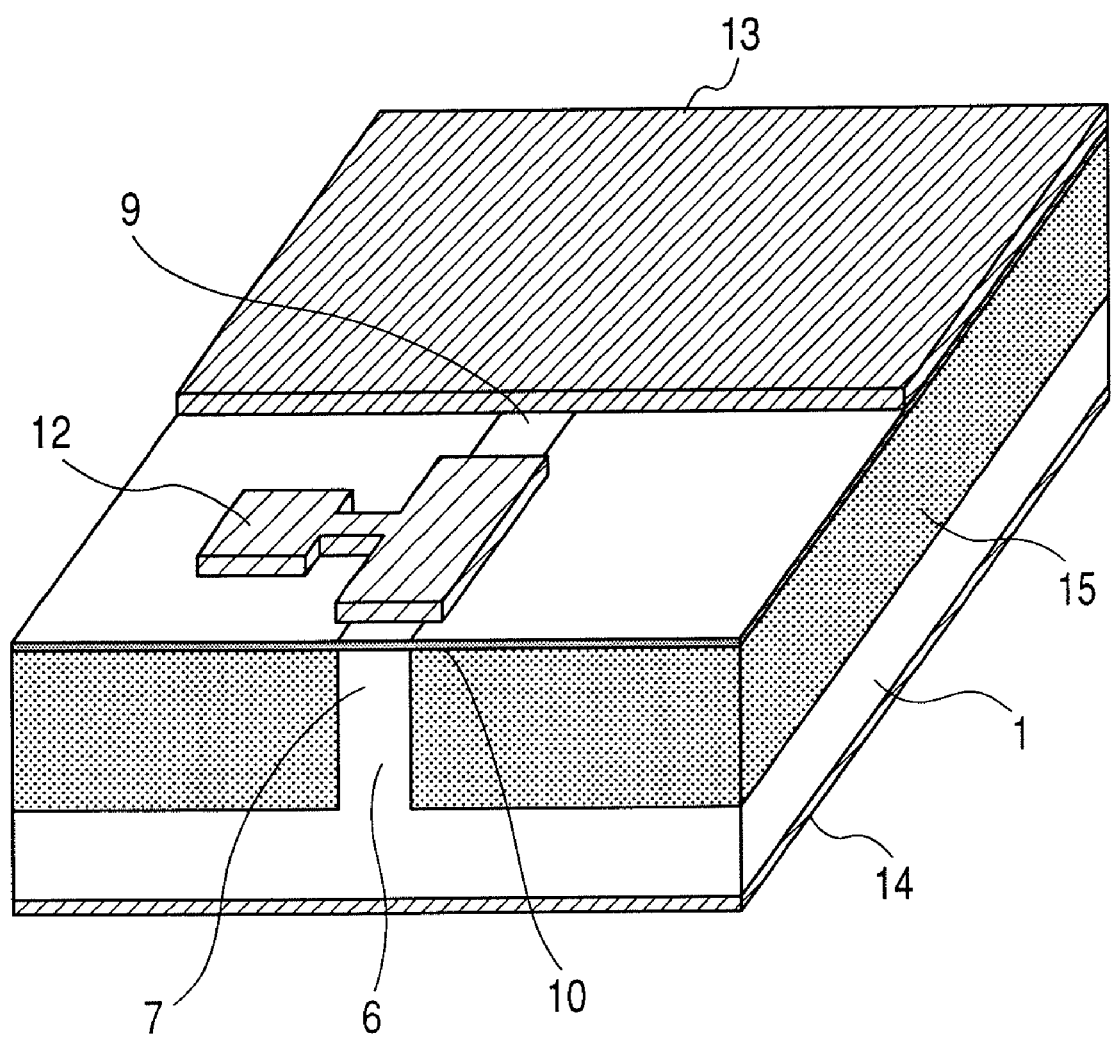
FIG. 7A is a perspective view of a BH type semiconductor optical integrated device of a third embodiment according to the invention.
Figure 7B:
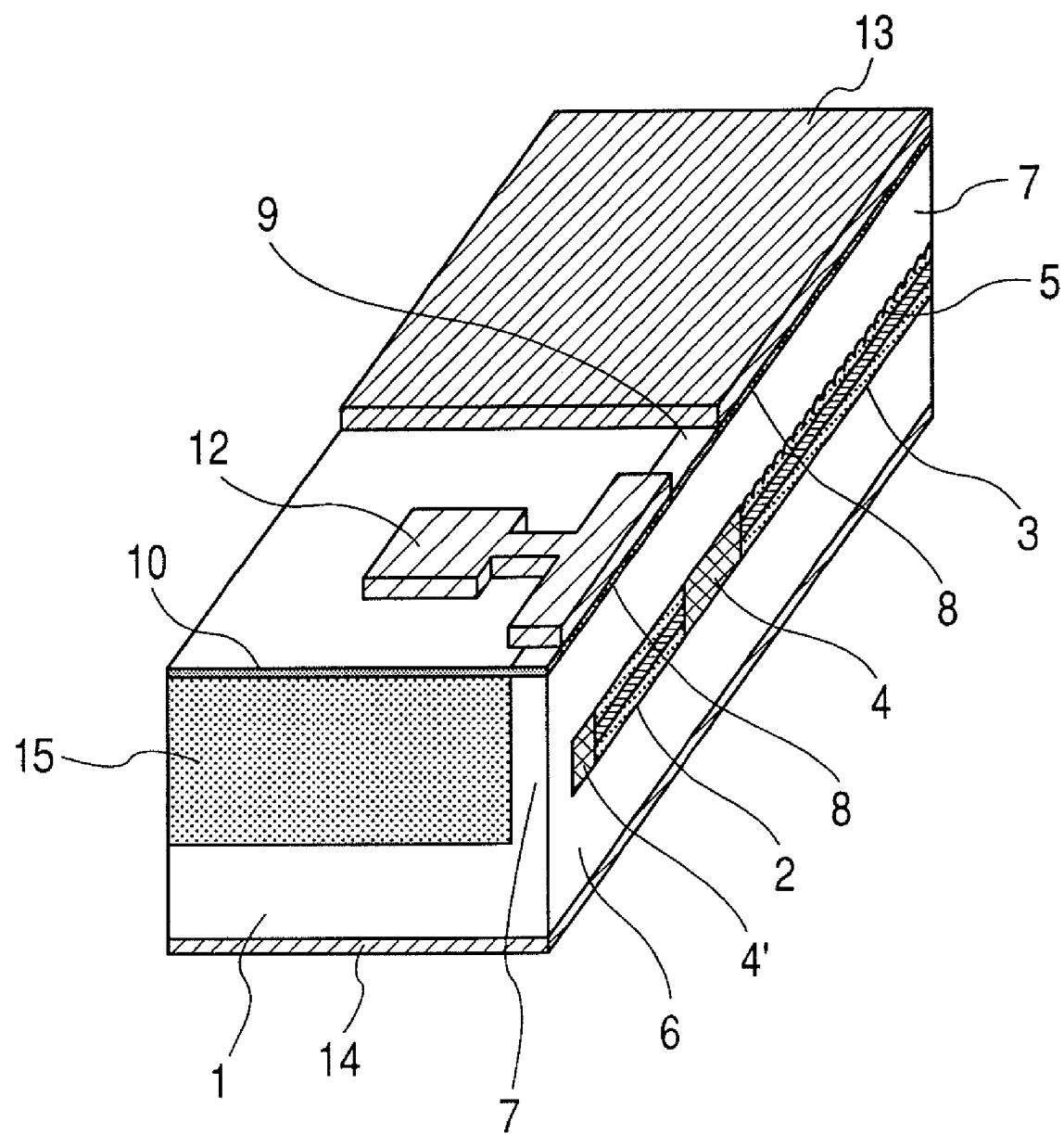
FIG. 7B is a perspective view showing a cross section taken along a central portion of a BH type semiconductor optical integrated device in a third embodiment according to the invention.

FIG. 7A shows a perspective view and FIG. 7B shows a perspective view showing a cross section taken along a central portion according to an embodiment of a semiconductor optical integrated device applied with the invention.

In this case, the drawing for the manufacturing step of the device shown in FIG. 5 of the first embodiment is to be omitted.

However, the drawings are only for description of this embodiment and the size of the drawing and the reduced scale described in this embodiment do not always agree to each other.

A quantum well structure 2 comprising an InGaAlAs-based material as an electro-absorption optical modulator is formed by an MOCVD method above an n-InP type substrate 1. For the quantum well structure, an optical confinement structure sufficient for extinction can be formed by alternately stacking quantum wells and barrier layers by about 10 layers. Successively, etching is conducted as far as the surface of the n-InP substrate 1 while leaving a predetermined length of an electro-absorption optical modulator. The step is identical with the state shown in FIG. 5A and FIG. 5B.

Then, there is formed a quantum well structure 3 comprising an InGaAlAs-based material forming a semiconductor laser portion. Further, an optical confinement structure suitable to laser oscillation can be formed by alternately stacking quantum wells and barrier layers by about 8 layers.

Successively, etching is conducted as far as the surface for the n-InP substrate 1 while leaving a desired length of the electro-absorption optical modulator and the semiconductor laser portion so as not to give undesired effect on the electro-absorption optical modulator portion 2 and the semiconductor laser portion 3. The step is identical with the state shown in FIG. 5C and FIG. 5D.

Then, an optical waveguide layer 4 comprising an InGaAsP-based material is formed between the electro-absorption optical modulator portion and the semiconductor laser portion and an optical waveguide layer 4' also comprising the InGaAsP-based material is formed between the light emitting edge and the electro-absorption optical modulator. As the detailed structure for the optical waveguide layer, it is desirable, for example, a structure of stacking an InGaAsP growing layer of 200 nm thickness and 1300 nm compositional wavelength successively to an InGaAsP bulk grown layer of 100 nm thickness and 1150 nm compositional wavelength and further stacking an InGaAsP bulk grown layer of 100 nm thickness and 1150 nm compositional wavelength. With the structure described above, an optical waveguide layer of less optical loss can be formed. The step is identical with the state shown in FIG. 5E.

Then, a diffraction grating 5 is formed by etching above the quantum well structure 3 comprising an InGaAlAs-based material forming the semiconductor laser portion 3. As the diffraction grating layer, a semiconductor with a refractive index higher than that of InP is preferred. For example, an InGaAsP grown layer of 30 nm thickness and 1150 nm compositional wavelength is preferred. For the formation of the diffraction grating, pattern formation to a resist by a holographic exposure method or an electron beam drawing method and a wet or dry etching process as known techniques may be combined. As a specific resist pattern, stripes at about 240 nm distance may be formed in the direction perpendicular to a mesa. This can provide a stable longitudinal single mode oscillation suitable to optical communication.

The step is identical with the state shown in FIG. 5F.

Then, a portion of the optical waveguide layer 4' comprising an InGaAsP-based material between the light emitting edge and the electro-absorption optical modulator on the side of the light emitting edge is etched as far as the n-InP substrate 1 to form a window structure 6.

The step is identical with the state shown in FIG. 5G.

Successively, a p-InP layer 7 and a p$^+$ contact layer 8 are formed by an MOCVD method. The step is identical with the step shown in FIG. 5H. Successively, etching is conducted as far as the n-InP substrate 1 to form a ridge portion (high mesa structure) 9. Successively, for electrically isolating the modulator and the DFB laser and forming the newly proposed window structure, the p$^+$ contact layer 8 is removed by etching while leaving a desired portion. The state is substantially identical with that in FIG. 5I. Since etching is conducted as far as the n-InP substrate 1 in the third embodiment, it is different from FIG. 5I in that the ridge portion 9 stands upright above the substrate 1, and the window structure 6, the quantum well structure 2, the optical waveguide layer 4, the optical waveguide layer 4' and the quantum well structure 3 with the diffraction grating 5 being formed upward are formed only to the base of the ridge portion 9. In this case, a stable transverse single mode oscillation suitable to optical communication is obtained by defining the ridge width to about 2 μm.

Successively, a semi-insulating InP layer 15 is grown on both sides of the ridge portion 9 by an MOCVD method to form a buried-hetero structure. Successively, a silicon oxide film 10 is formed over the entire surface by a CVD method and the silicon oxide film 10 is removed only at the region forming the p-electrode 12 for the optical modulator portion and the p-electrode 13 for the semiconductor layer portion in the ridge portion 9 of the semiconductor light emitting device and the electro-absorption optical modulator portion. While the silicon oxide film is used in the second embodiment, a silicon nitride film or the like may also be used alternatively.

Successively, the p-electrode 12 for the optical modulator portion and the p-electrode 13 for the semiconductor laser portion are formed. As the electrode material, known Ti and Au may be stacked successively. Then, an n-electrode 14 is formed at the back surface of the n-InP substrate 1. As the electrode material, known AuGe, Ti, and Au may be stacked successively. After forming the electrode, the device is cut out by cleaving to form a reflection film at a reflectance of about 90% on the rear edge and a low reflection film at a reflectance of 1% or less is formed on the front edge. In the drawings, such films are not illustrated.

According to the method described above, a buried-hetero (BH) type semiconductor optical integrated device in which the electro-absorption optical modulator portion 2 and the semiconductor laser portion 3 are integrated on one identical substrate can be prepared. The order of crystal growth of the electro-absorption optical modulator portion 2, the optical waveguide layer 4, the optical waveguide layer 4', and the semiconductor laser portion 3 is not restricted thereto. For example, the obtained device structure does not change even when the DFB laser portion is formed initially. As the material for the electro-absorption optical modulation portion 2, the quantum well structure may comprises InGaAlAs, InGaAsP, InGaAs or GaInNAs for the well layer and the barrier layer may comprise InGaAlAs, InAlAs, or GaInNAs. Further, as the material for the semiconductor laser portion, InGaAsP-based material or GaInNAs-based material may also be used instead of the InGaAlAs-based material. Further, as the material for the optical waveguide layer 4 and the optical waveguide layer 4', the InGaAlAs-based material or GaInNAs-based material may also be used instead of the InGaAsP-based material. Further, formation of the optical waveguide layer 4 and the optical waveguide layer 4' in FIG. 5E is not necessarily conducted simultaneously but this is convenient since the number of cycles for crystal growth is reduced. Further, the optical waveguide layer 4 between the electro-absorption optical modulator and the semiconductor layer portion is not always necessary.

Further, the crystal growth method is not always restricted to the MOCVD method but it may be formed by an MBE method or the like. Further, the electro-absorption optical modulator portion 2', the optical waveguide layer 4, the optical waveguide layer 4', and the semiconductor laser portion 3 may be formed by a crystal growth step for once using a selective area growth method. Further, the material for planarizing the wafer is not restricted to the polyimide. Furthermore, planarization is not always necessary.

From the procedures described above, also the method of manufacturing the device in a case where the DFB laser portion is replaced with a structure having other optical functions such as a DBR laser or SOA can be deduced easily.

The operation method of the semiconductor optical integrated device according to the third embodiment is identical for the first embodiment.

Further, also the manufacturing method and the operation method of the curved waveguide type semiconductor optical integrated device in the BH structure described for the third embodiment may be reduced easily from the first and the second embodiments.

Fourth Embodiment

This embodiment concerns an RWG-EA/tunable wavelength LD.

Figure 8A:
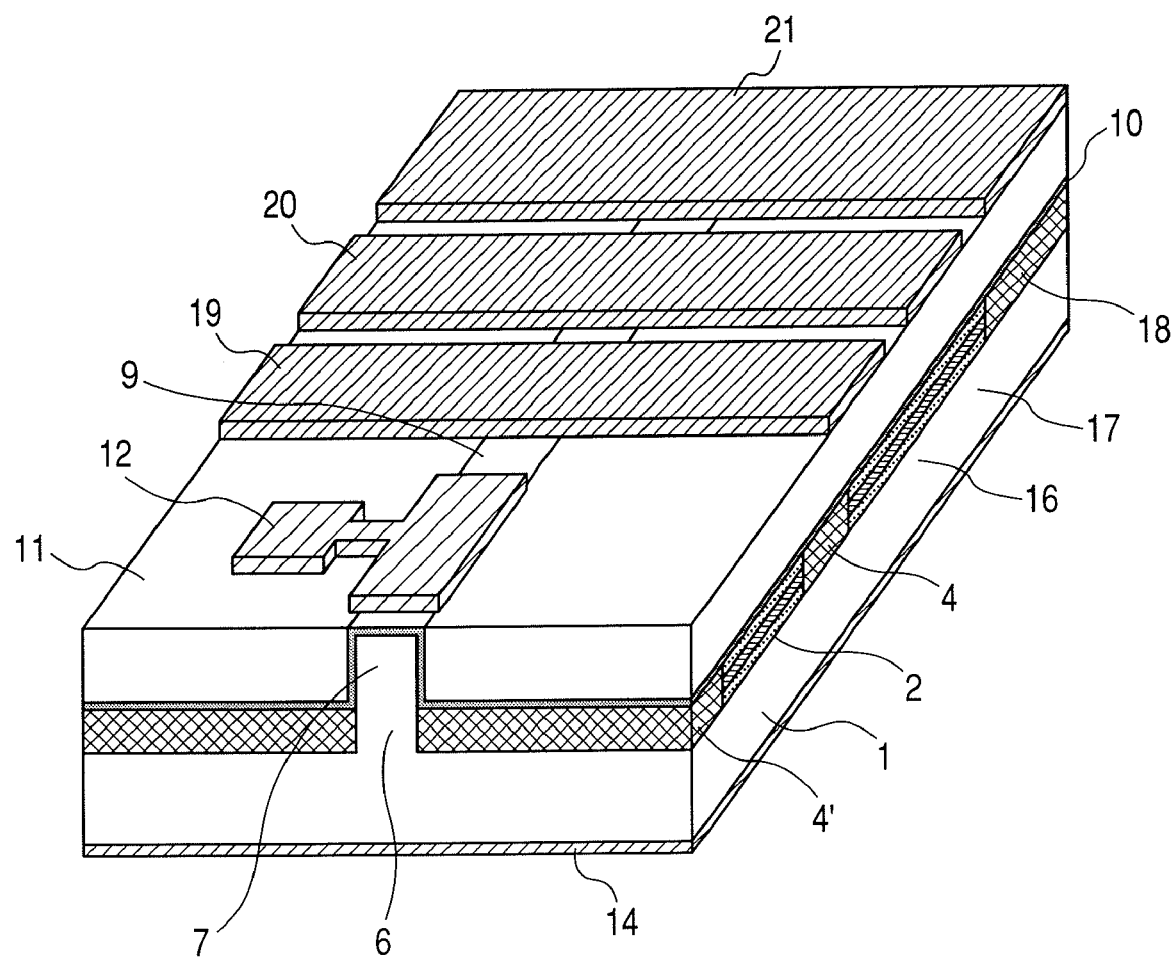
FIG. 8A is a perspective view for the constitution of a semiconductor optical integrated device in which a semiconductor laser is a tunable wavelength laser in a fourth embodiment according to the invention.
Figure 8B:
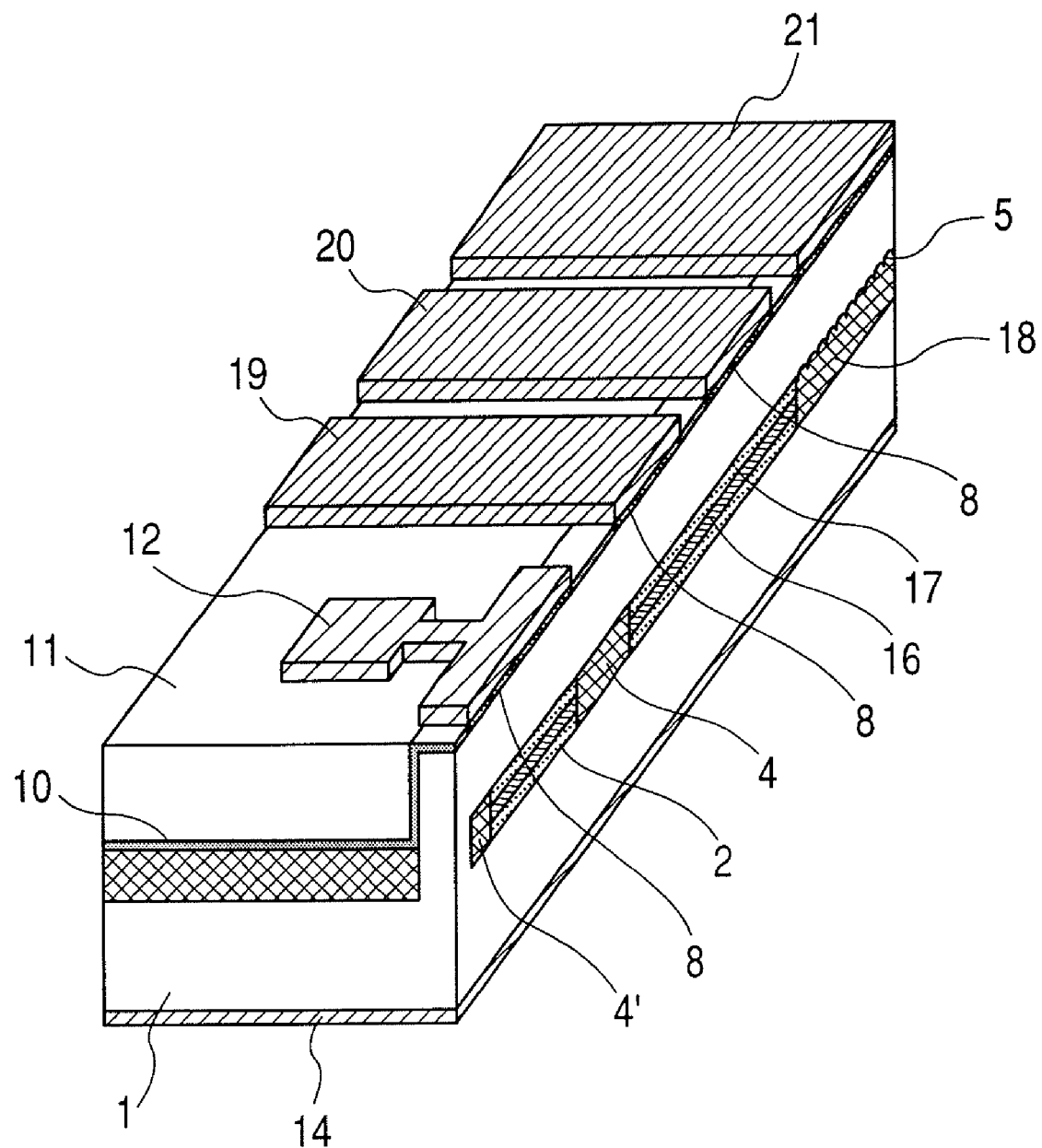
FIG. 8B is a perspective view showing a cross section taken along a central portion of a semiconductor optical integrated device in which a semiconductor laser is a tunable wavelength laser in the fourth embodiment according to the invention.

FIG. 8A shows a perspective view and FIG. 8B shows a perspective view showing a cross section taken along a central portion of a constitution according to an embodiment of a semiconductor optical integrated device constituted as wavelength tunable LD by applying the invention.

Also in this case, the drawing for the steps shown in FIG. 5 for the first embodiment is omitted. However, the drawings are only for description of this embodiment and the size of the drawing and the reduced scale described in this embodiment do not always agree to each other.

A quantum well structure 2 comprising an InGaAlAs-based material as an electro-absorption optical modulator is formed by an MOCVD method above an n-InP type substrate 1. For the quantum well structure 2, an optical confinement structure sufficient for extinction can be formed by alternately stacking quantum wells and barrier layers by about 10 layers. Successively, etching is conducted as far as the surface of the n-InP substrate 1 while leaving a predetermined length of an electro-absorption optical modulator 2. The step is identical with the state shown in FIG. 5A and FIG. 5B.

Then, a quantum well structure 3 comprising an InGaAlAs-based material forming a semiconductor laser portion. An optical confinement structure suitable to laser oscillation can be formed by alternately stacking quantum wells and barrier layers by about 8 layers.

Successively, etching is conducted as far as the surface of the n-InP substrate 1 while leaving a desired length of the electron-absorption optical modulator portion 2 and the active resin 16 and a phase control region 17 by the quantum well structure 3 so as not to give undesired effect on the electro-absorption optical modulator portion 2 and the semiconductor laser portion 3. While the step is identical with the state shown in FIGS. 5C, D, since the optical waveguide 4 is formed on the side of the phase control region 17 of a desired length by the quantum well structure 3 on the side opposite to the electro-absorption optical modulator portion 2 in the wavelength tunable LD, it is different in that etching is conducted as far as the surface of the n-InP substrate 1 by a predetermined length also for the portion of the quantum well structure 3 on the side opposite to the electro-absorption optical modulator portion 2.

Then, the optical waveguide layer 4 comprising the InGaAsP-based material and the optical waveguide layer 4' also comprising the InGaAsP-based material are formed between the light emitting edge and the electro-absorption optical modulator portion 2 to a portion between the electro-absorption optical modulator portion 2 and the predetermined length of the active region 16 by the quantum well structure 3 and in the region adjacent with the desired length of the phase control region 17 by the quantum well structure 3. As the detailed structure for the optical waveguide layer 4 and the optical waveguide layer 4', it is desirable a structure formed by stacking, for example, an InGaAsP grown layer of 200 nm thickness and 1300 nm compositional wavelength successively to the InGaAsP bulk growing layer of 100 nm thickness and 1150 nm compositional wavelength and, further, stacking an InGaAsP bulk grown layer of 100 nm thickness and 1150 nm compositional wavelength. With the structure described above, an optical waveguide layer of less optical loss can be formed.

Then, a diffraction grating 5 is formed by etching to a desired region of the optical waveguide layer 4 comprising an InGaAsP-based material of a region adjacent with the phase control region 17, to form a distribution reflection type region 18. For forming the diffraction grating, pattern formation to a resist by holographic exposure method or an electron beam drawing method and a wet or dry etching step as known techniques may be combined.

Then, a portion of the optical waveguide layer 4' comprising the InGaAsP-based material between the light emitting edge and the electro-absorption optical modulator portion 2 is etched as far as the n-InP substrate 1 to form a window structure 6. The step is identical with the state shown in FIG. 5G.

Successively, a p-InP layer 7 and a p$^+$-contact layer 8 are formed by an MOCVD method. The step is identical with the step shown in FIG. 5H. Then, a ridge waveguide structure 9 is formed by etching the p$^+$ contact layer 8 and the p-InP layer 7 as far as the surface of the quantum well structure 2 comprising the In, Ga, Al, As-based material forming the electro-absorption optical modulator, and the quantum well structure 3 comprising the In, Ga, Al, As-based material forming the semiconductor laser portion, the optical waveguide layer 4, and the optical waveguide layer 4'. Successively, for electrically isolating the modulator and the laser and forming newly proposed the window structure, the p$^+$ contact layer 8 is removed by etching while leaving the desired portion. The step is identical with the state shown in FIG. 5I. In this case, a stable transverse single mode oscillation suitable to optical communication is obtained by defining the mesa width to about 2 μm.

Successively, a silicon oxide film 10 is formed over the entire surface by a CVD method. Then, the silicon oxide film 10 at the top of the mesa waveguide 9 is removed from a position corresponding to the p electrode 12 for the modulation portion, the p-electrode 19 for the active region, p electrode 20 for the phase control region, and the distribution reflection type region 21 to be described later. In this case, while the silicon oxide film is used in the fourth embodiment, a silicon nitride film or the like may also be used alternatively. The step is identical with the state shown in FIG. 5J.

Then, the wafer is planarized by the polyimide resin 11 to the height for the top surface of the mesa waveguide 9 removed with the silicon oxide film 10. The step is identical with the state shown in FIG. 5K. Successively, the p-electrode 12 for the optical modulator, the p-electrode 19 for the active region, the p-electrode 20 for the phase control region, and the p-electrode 21 for the distribution reflection type region are formed. As the electrode material, known Ti and Au may be stacked successively. Successively, an n-electrode 14 is formed at the back surface of the n-InP substrate 1. As the electrode material, known AuGe, Ti, Au may also be stacked successively. After forming the electrode, the device is cut out by cleaving to form a reflection film at a reflectance of about 90% on the rear edge and a reflection film of low reflectance of 1% or less on the front edge. Such films are not illustrated in the drawing. The step is identical with that shown in FIG. 5L.

According to the method described above, a ridge waveguide type semiconductor optical integrated device in which the electro-absorption optical modulator portion 2 and the tunable wavelength laser portion 3 are integrated on one identical substrate can be prepared. The order of crystal growth for the electro-absorption optical modulator portion 2, the optical waveguide layer 4, the optical waveguide layer 4', and the tunable wavelength laser portion 3 is not restricted thereto. As the material for the electro-absorption optical modulator portion 2, the quantum well structure may comprise InGaAlAs, InGaAsP, InGaAs or GaInNAs for the well layer, and InGaAlAs, InAlAs, or GaInNAs for the barrier layer. Further, as the material for the tunable wavelength laser portion 3, an InGaAsP-based material or GaInNAs-based material may be used instead of the InGaAlAs-based material, and as the material for the optical waveguide 4 and the optical waveguide layer 4', an InGaAlAs-based material or GaInNAs-based material may also be used instead of the InGaAsP-based material. Further, the crystal growth method is not always restricted to the MOCVD method, but the portion may be formed, for example, by the MBE method. Further, the electro-absorption optical modulator portion 2, the optical waveguide layer 4, the optical waveguide layer 4' and the tunable wavelength laser portion 3 may be formed by the crystal growth step only for once by using selective area growing method. Further, also the manufacturing method of the buried-hetero (BH) integrated device can also be deduced easily from the first and third embodiments. Further, the material for planarizing the wafer is not always restricted to the polyimide. Further, planarization by the polyimide or the like is not always necessary.

Then, the operation method of the semiconductor optical integrated device of the fourth embodiment is to be described. Laser oscillation is obtained by applying a forward bias to the p-electrode 19 for the active region. In this case, since the light periodically undergoes feedback by the distribution reflection region 18, the oscillation spectrum is a single mode. The Bragg's reflection condition can be changed to change the laser oscillation wavelength by supplying a current in the p electrode 21 for the distribution reflection region. Further, a continuous wavelength variation with no mode hop can be attained by supplying a current to the p-electrode 20 for the phase control region. Further, it will be deduced easily that use in a wider wavelength band is also possible by forming the tunable wavelength laser in an array form.

Also the modification method of the laser light in the fourth embodiment may also be deduced easily based on the first embodiment.

Further, also the manufacturing method and the operation method of the curved waveguide device in the EA/tunable wavelength laser integrated structure described in the fourth embodiment can also be deduced easily based on the first and second embodiments.

Fifth Embodiment

This embodiment concerns a module using an EA/DFB having a novel window structure.

A preferred embodiment of a transceiver module using the semiconductor optical integrated device described with reference to first, second, or third embodiment is to be described with reference to FIG. 9. However, the drawing is only for description of this embodiment and the size of the drawing and the reduction scale described in this embodiment do not always agree with each other.

22 denotes a small-sized optical transmission module, in which a semiconductor optical integrated device 23 formed by integrating the laser portion 32 and the electro-absorption optical modulator 33 according to the invention is mounted on an internal substrate 22'. A lens 26 is held by a lens support 27' at the top end of the module 22. The semiconductor optical integrated device 23 and the lens 26 are arranged such that the optical axis of light generated by the laser portion 32 is aligned therewith. A thermistor 24 is disposed near the semiconductor optical integrated device 23 on the internal substrate 22' to output a signal for the temperature in the module. Further, a light receiving element 25 for monitoring is disposed behind the semiconductor optical integrated device 23 to detect an optical output by the light leaked behind the laser portion 32. The output from the light receiving element 25 for monitoring is utilized as an operation temperature signal of the laser portion 32. A control device 31 is disposed adjacent with the small-sized optical transmission module 22 and the control device 31 is provided with an optical modulator control circuit 34 and an optical laser control circuit 35. Lead lines 29 are disposed between the small-sized optical transmission module 22 and the control device 31 for transmitting and receiving necessary signals between both of them. Further, 30 denotes wires for connecting the lead lines 29 with respective devices. A high frequency line 28 gives a signals from the optical modulator control circuit 34 to the optical modulator 33. The electric signals in accordance with the intensity of light incident to the light receiving device 25 for monitoring are sent by way of the wire 30 and the leads 29 to the optical laser control circuit 35 of the control device 31 to apply a feed back control to the value of current flowing to the laser portion 32 of the semiconductor optical integrated device 23 so as to obtain a desired optical output.

As described above, the semiconductor light emitting device formed by using this technique can be used as an optical transmitter by monitoring the temperature in the small-sized optical transmission module 22 by the thermistor 24 to control the optical modulator 33 and by monitoring the operation temperature of the laser portion 32 by the light receiving element 25 for monitoring to control the laser portion 32. Further, in FIG. 9, while the control circuit and the device constituting the module are connected by way of wires and lead lines, they may also be integrated monolithically in one identical chip. By using the module, a high speed optical signals suitable for size reduction and reduction of power consumption and for long distance transmission can be prepared easily. Further, in FIG. 9 and FIG. 10, description for the wavelength tunable semiconductor optical integrated device is omitted.

Sixth Embodiment

This embodiment concerns an optical communication system.

Figure 9:
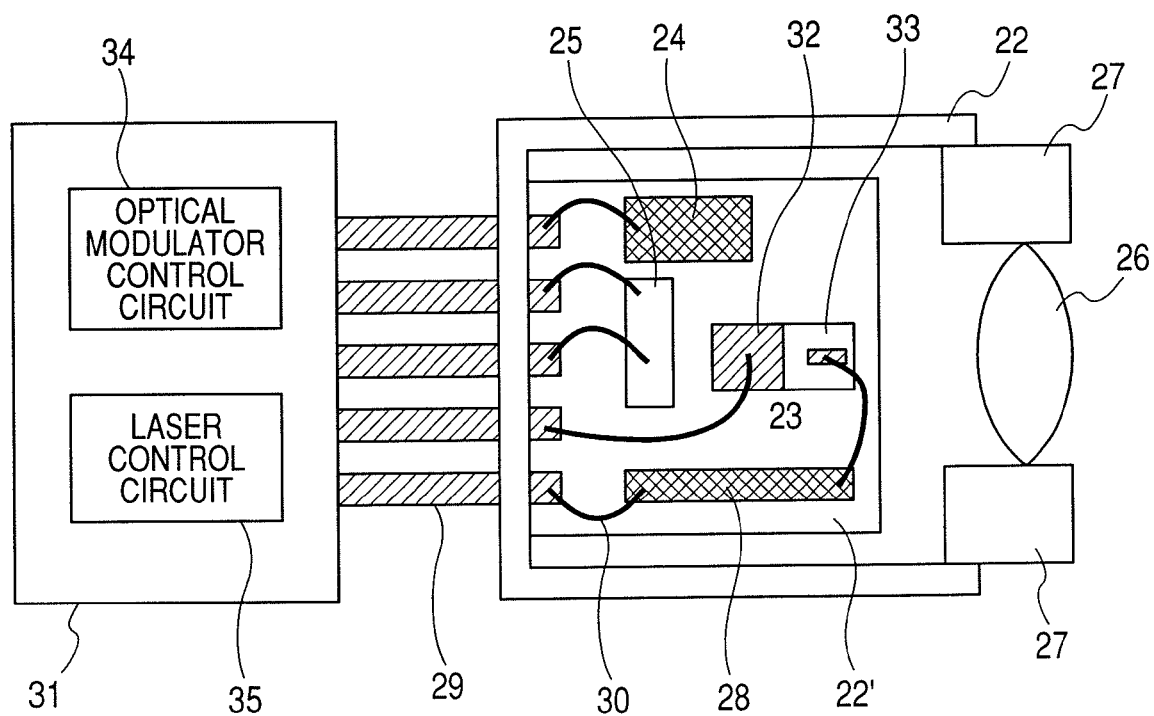
FIG. 9 is an outlined view showing the outline of a transceiver module structure using a semiconductor optical integrated device described for the first, second, or third embodiment in a fifth embodiment of the invention.
Figure 10:
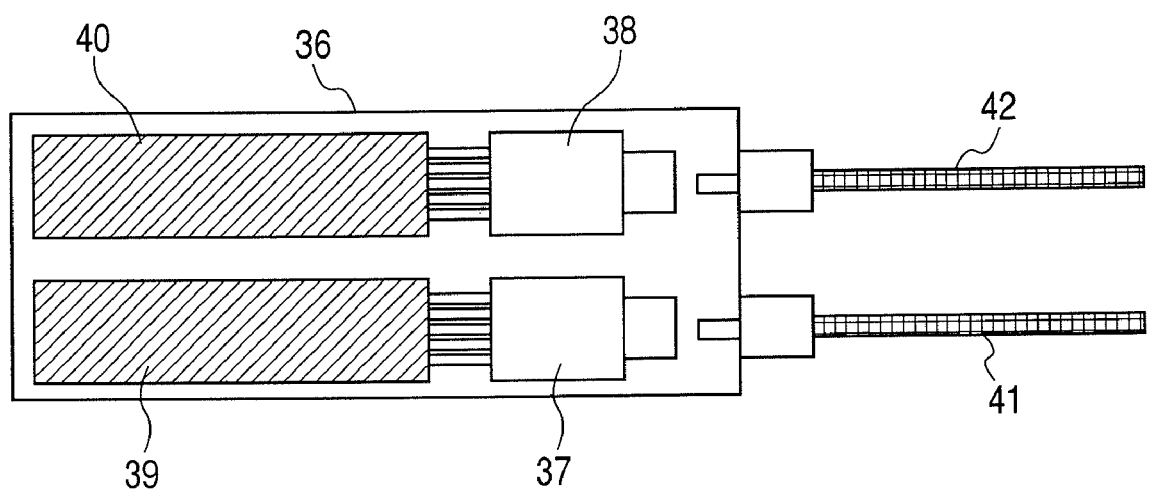
FIG. 10 is a schematic view constituting a terminal of an optical communication system by an optical transceiver package mounting an optical transmission module and an optical receiving module prepared separately according to the invention described for the fifth embodiment in a sixth embodiment of the invention.

FIG. 10 is a schematic view constituting the terminal of an optical communication system by an optical transceiver package mounting an optical transmission module of the invention described in FIG. 9 and an optical receiving module prepared separately. In the drawing, are shown an optical transceiver package 36, a small-sized transmission module 37, an optical transmission module driving circuit 39, a small-sized receiving module 38, an optical receiving module driving circuit 40, and optical fibers 41 and 42. They are disposed corresponding to the small-size transmission module 37 and the optical receiving module 38.

What is claimed is:

1. A semiconductor optical device including:
   an electro-absorption optical modulation region on a substrate, in which
   a window is disposed for suppressing optical feedback from the outside of the device on the side of the emitting edge of the optical modulation region and on the emitting edge of the device, and at the emitting edge of the device,
   a first optical waveguide having a bandgap value larger than the bandgap value of the active layer material in the optical modulation region and being undoped is disposed to the optical modulation region and the window.

2. The semiconductor optical device according to claim 1, wherein one end of the first optical waveguide is connected with one end of the optical modulation region, and the other end of the first optical waveguide is connected with one end of the window.

3. The semiconductor optical device according to claim 1, wherein one end of the first optical waveguide is butt-jointed with one end of the optical modulation region and the other end of the first optical waveguide is butt-jointed with one end of the window.

4. The semiconductor optical device according to claim 1, wherein the window has a pn junction.

5. The semiconductor optical device according to claim 1, wherein an undope electro-absorption optical modulation region is disposed between the n-cladding layer disposed on the substrate and the p-cladding layer disposed above the n-cladding layer and the three layers constitute a pin structure.

6. The semiconductor optical device according to claim 1, wherein a $p^+$ contact layer is disposed overriding an upper portion of at least a portion of the region of the optical modulation region and the first optical waveguide, and a p-electrode is disposed thereover independently.

7. The semiconductor optical device according to claim 6, wherein the contact layer on the junction boundary the first optical waveguide and the window and on the window is removed.

8. The semiconductor optical device according to claim 1,
   wherein the optical modulation region has an optical modulator comprising a single material or a multi-quantum well structure, and
   wherein a material constituting the multi-quantum well structure has a set of In, Ga, Al, and As, has a set of In, Ga, As, and P, or has a set of In, Ga, As, and N.

9. The semiconductor optical device according to claim 1, wherein a semiconductor laser region is disposed separately from the optical modulation region above the substrate, and the semiconductor laser region and the optical modulation region are optically connected by butt joint by way of the second optical waveguide.

10. The semiconductor optical device according to claim 9, wherein the semiconductor laser region is provided with at least one of a DFB laser (distributed feedback laser), a DBR laser (distributed Bragg reflector laser), a tunable wavelength laser, or a semiconductor optical amplifier.

11. The semiconductor optical device according to claim 1, wherein other optical functional region having a function different from optical modulation is disposed separately from the optical modulation region above the substrate.

12. The semiconductor optical device according to claim 11, wherein the optical function region is a passive optical waveguide having a set of In, Ga, Al, and As, a set having In, Ga, As, and P, or a set having In, Ga, As, and N.

13. The semiconductor optical device according to claim 11, wherein a second optical waveguide having a set having In, Ga, Al, and As, a set having an In, Ga, As, and P, or a set having In, Ga, As, and N is disposed between the optical modulation region and the other optical functional region, one end of the optical modulation region and one end of the second optical waveguide are butt-jointed and one end of other optical functional region and the other end of the second optical waveguide are butt-joined.

14. The semiconductor optical device according to claim 1, wherein the first optical waveguide is a curved optical waveguide with the optical axis being in a curved shape.

15. The semiconductor optical device according to claim 10,
wherein the active layer of a DFB laser (distributed feed back laser), a DBR laser (distributed Bragg reflector laser), a tunable wavelength laser, or a semiconductor optical amplifier is constituted by using a single bulk layer or comprises a multi-quantum well structures, and
wherein the quantum well structure is constituted by using a material of one of a set having In, Ga, As, and P, a set having In, Ga, Al, and As, or a set having In, Ga, As, and N.

16. A method of manufacturing a semiconductor optical device comprising the following steps of:
(a) forming a first quantum well region as an electro-absorption optical modulator above a semiconductor substrate, and removing other first quantum well region while leaving the first quantum well region to form the optical modulator,
(b) forming a second quantum well region to be a semiconductor laser portion above the substrate in a region removed by the step (a),
(c) removing a portion where the first quantum well region and the second quantum well region above the substrate are in contact with each other and the peripheral portion thereof, and a portion of the first quantum well region on the side opposite to the portion of contact of the second quantum well region,
(d) forming a member as the first optical waveguide to two regions of the portion where the removed first quantum well region and the second quantum well region are in contact with each other and the peripheral portion thereof above the substrate, and forming a member as a second optical waveguide to a portion of the first quantum well region on the side opposite to the contact portion of the removed second quantum well region,
(e) removing a portion of the second optical waveguide layer on the side of the light emitting edge in the direction of the thickness of the layer as far as the substrate and, subsequently, forming a space portion as a window structure (6),
(f) forming an upper cladding layer and a $p^+$ contact layer to a space portion above the first and the second quantum well regions, above the first and the second optical waveguides, and to the space portion as the window structure (6) above the substrate,
(g) partially removing the contact layer for electrically isolating the contact layer above the portion as the optical modulator and above the portion as the semiconductor laser portion, and removing the contact layer for other portion such that the contact layer above the portion as the optical modulator is present while overriding at least a portion of the region of the second optical waveguide, and
(h) forming electrodes on a plurality of separated contact layers respectively.

17. The manufacturing method of a semiconductor device according to claim 16, wherein a step of forming a diffraction grating above the second quantum well region as the semiconductor laser portion is provided after the step (d).

18. The manufacturing method of a semiconductor device according to claim 16, wherein the device portion is a ridge type or a buried type.

19. The manufacturing method of a semiconductor device according to claim 16, wherein at least one of a metal-organic vapor phase epitaxy method or a molecular beam epitaxy method is used for the crystal growth step.

* * * * *